United States Patent [19]

Kozaru et al.

[11] Patent Number: 5,991,223
[45] Date of Patent: Nov. 23, 1999

[54] SYNCHRONOUS SEMICONDUCTOR MEMORY DEVICE OPERABLE IN A BURST MODE

[75] Inventors: Kunihiko Kozaru; Shigeki Ohbayashi, both of Hyogo, Japan

[73] Assignee: Mitsubishi Denki Kabushiki Kaisha, Tokyo, Japan

[21] Appl. No.: 09/061,254

[22] Filed: Apr. 17, 1998

[30] Foreign Application Priority Data

Nov. 25, 1997  [JP]  Japan ................................. 9-323447

[51] Int. Cl.$^6$ ................................................. G11C 7/00
[52] U.S. Cl. ........................... 365/230.03; 365/233
[58] Field of Search .................... 365/230.03, 233, 365/238.5, 230.01

[56] References Cited

U.S. PATENT DOCUMENTS 5,619,456  4/1997  McClure ................................. 365/233
5,822,254  10/1998  Koshikawa et al. ..................... 365/233

OTHER PUBLICATIONS

"A 167MHz 1–Mbit CMOS Synchronous Cache SRAM", H. Yahata et al., IEICE Transaction on Electronics, vol. E80–C, No. 4, Apr. 1997, pp. 557–565.

*Primary Examiner*—Vu A. Le
*Attorney, Agent, or Firm*—McDermott, Will & Emery

[57] ABSTRACT

Predetermined bits of an address signal taken into an address register are taken into a burst address counter and are changed in synchronization with a clock signal. The address bits from the burst address counter are applied to a block decoder for selecting a memory sub-array from the plurality of memory sub-arrays. A block address and the memory sub-array to be selected change at every clock cycle. An operation frequency of data read circuits provided for the respective memory sub-arrays can be made lower than a frequency of the clock signal. Memory cell data can be read out accurately even in a high-frequency operation.

18 Claims, 20 Drawing Sheets

FIG. 15
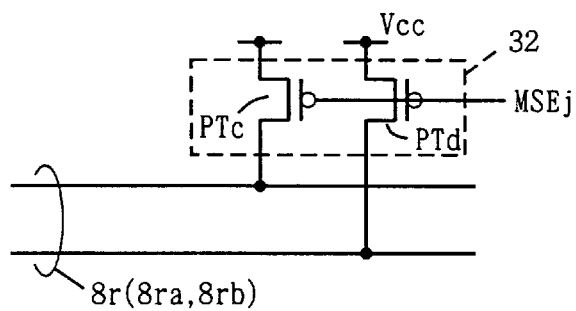
FIG. 16
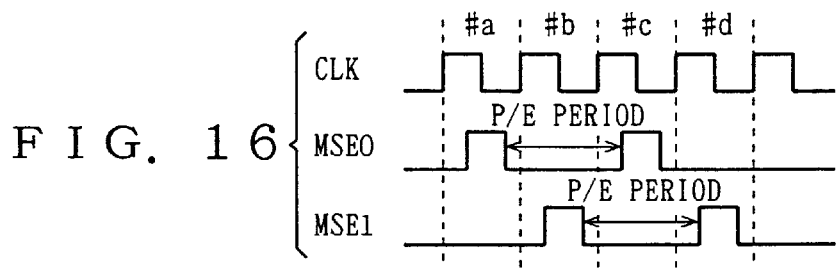
FIG. 17
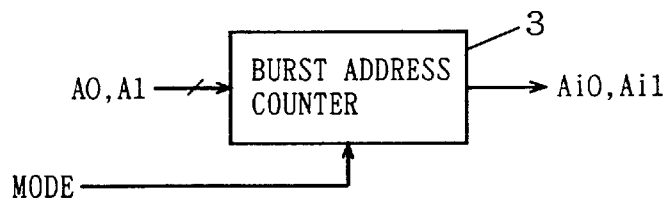
FIG. 18A
|  | Ai1 | Ai0 |
|---|---|---|
| 1ST CYCLE | A1 | A0 |
| 2ND CYCLE | A1 | /A0 |
| 3RD CYCLE | /A1 | A0 |
| 4TH CYCLE | /A1 | /A0 |
FIG. 18B
|  |  |  |  |  |
|---|---|---|---|---|
| 1ST CYCLE | BS0 | BS1 | BS2 | BS3 |
| 2ND CYCLE | BS1 | BS0 | BS3 | BS2 |
| 3RD CYCLE | BS2 | BS3 | BS0 | BS1 |
| 4TH CYCLE | BS3 | BS2 | BS1 | BS0 |

| 1ST CYCLE | BS0 | BS1 | BS2 | BS3 |
| --- | --- | --- | --- | --- |
| 2ND CYCLE | BS1 | BS2 | BS3 | BS0 |
| 3RD CYCLE | BS2 | BS3 | BS0 | BS1 |
| 4TH CYCLE | BS3 | BS0 | BS1 | BS2 |

SYNCHRONOUS SEMICONDUCTOR MEMORY DEVICE OPERABLE IN A BURST MODE

BACKGROUND OF THE INVENTION

1. Field of the Invention

The present invention relates to a synchronous semiconductor memory device which operates in synchronization with a clock signal, and particularly to a structure of a data reading portion of a clock-synchronous static semiconductor memory device which can operate in a burst mode.

2. Description of the Background Art

For constructing a processing system, which can operate in a fast speed, by fulfilling a gap in operation speed between a main storage device and a microprocessor, such a structure has generally been used in recent years that a cache memory for storing data which are accessed with high frequency is generally arranged between the microprocessor and the main storage device. As such a cache memory, a synchronous burst SRAM (which will be referred to as a "BSRAM" in some cases hereinafter) which operates in synchronization with an external clock signal such as a system clock has been widely used.

FIG. 27 schematically shows a whole structure of a BSRAM in the prior art. The BSRAM shown in FIG. 27 is disclosed, e.g., in IEICE Transaction on Electronics, Vol. E80-C, No. 4, April 1997, pp. 557–565.

In FIG. 27, BSRAM includes a memory array 900 having a plurality of static memory cells arranged in rows and columns, a control circuit 902 which determines states of externally supplied control signals, i.e., an address advance signal /ADV, an address strobe signal /ADS, a write enable signal /WE and an output enable signal /OE at a rising of a clock signal CLK such as a system clock, and generates internal control signals for performing operations in accordance with a result of the determination, an address register 904 which takes in an externally supplied address signal Ade in accordance with an address strobe instructing signal received from control circuit 902, a burst address counter 906 which takes in predetermined bits of external address signal Ade taken into address register 904 and, and changes the address bits thus taken in a predetermined sequence under the control by control circuit 902, and a memory cell select circuit 908 which selects an addressed memory cell in memory array 900 in accordance with internal address signal Adi formed of remaining address signal bits from address register 904 and address bits from burst address counter 906.

Address advance signal /ADV enables the count operation of burst address counter 906. Control circuit 902 changes the count value of burst address counter 906 in synchronization with clock signal CLK when address advance signal /ADV is active (L-level). Burst address counter 906 takes in predetermined bits (column address bits) in address register 904 as a leading address, and performs the count operation in a predetermined sequence for output. Address register 904, which is controlled by control circuit 902, takes in external address signal Ade in synchronization with clock signal CLK when address strobe signal /ADS is active. Write enable signal /WE and output enable signal /OE are signals for enabling write/read of data and output of data, respectively. When signal /OE is at H-level, the BSRAM is in the data output high impedance state.

The BSRAM further includes a read/write circuit 910 which reads and writes data from and into a selected memory cell in memory array 900 under the control by control circuit 902, and an input/output register 912 which transmits data to and from read/write circuit 910 in synchronization with clock signal CLK under the control by control circuit 902. Input/output register 912 includes an input register for data writing and an output register for data output, and performs input and output of data applied thereto in synchronization with clock signal CLK. Read/write circuit 910 includes a main amplifier which is activated in the data read operation as well as a write driver which is activated in the data write operation. An operation of the BSRAM shown in FIG. 27 will be described below with reference to a timing chart of FIG. 28.

In clock cycle #1, address strobe signal /ADS is set to L-level at a rising edge of clock signal CLK. Control circuit 902 applies a strobe instructing signal to address register 904 in response to this activation of address strobe signal /ADS, i.e., to L-level thereof. Address register 904 takes in and latches externally applied address signal Ade(A) in accordance with the address strobe instructing signal from control circuit 902. The address signal taken into address register 904 is output as an internal address signal Adi in clock cycle #1. A predetermined address bit (e.g., the least significant column address signal bit) in the address signal issued from address register 904 is applied to burst address counter 906. Burst address counter 906 does not perform the counting, but operates to take in and output the address signal bit received from address register 904 when address advance signal /ADV is at H-level. In clock cycle #1, therefore, internal address signal Adi is generated in accordance with external address signal Ade.

In clock cycle #2, address strobe signal /ADS and address advance signal /ADV are set to H- and L-levels in synchronization with the rising edge of clock signal CLK, respectively. In this state, address register 904 is in the latching state, and does not take in the externally applied address signal. Meanwhile, burst address counter 906 performs the counting in synchronization with clock signal CLK under the control by control circuit 902, and changes the values of the address signal bits held therein. FIG. 28 represents by way of example an operation in which burst address counter 906 changes the count value by incrementing the count by one, starting from the taken address signal bit.

In this clock cycle #2, memory cell select circuit 908 performs the memory cell selection in accordance with address signal A applied at the rising edge of clock signal CLK and, more specifically, selects an addressed memory cell in memory array 900, and read/write circuit 910 reads data from the selected memory cell. The data read from read/write circuit 910 is latched by input/output register 912.

At next clock cycle #3, data Q(A) which is supplied from input/output register 912 at the rising of clock signal CLK is sampled as output data by a processing device such as an external processor. Inside the BSRAM, the memory selection is performed in accordance with address signal A+1 changed by burst address counter 906, and read/write circuit 910 reads the data of the selected memory cell. When the output data of read/write circuit 910 is made definite, I/O register 912 takes in the definite data. In clock cycle #3, therefore, memory cell data Q(A+1) at this address A+1 is read out, and is made definite at the rising edge of clock signal CLK in clock cycle #4.

In the BSRAM, address advance signal /ADV is set to L-level at each of clock cycles #3 and #4, and address strobe signal /ADS is held at H-level so that burst address counter 906 performs counting under the control by control circuit 902 to increment successively its address to A+2 and A+3.

Thereby, the memory selection is performed in accordance with internal address signals A+2 and A+3 at clock cycles #4 and #5, respectively, and the data of the selected memory cells are output from I/O register 912 and are definite at the rising edge of clock signal CLK in clock cycles #5 and #6, respectively.

As shown in FIG. 28, data is read in synchronization with clock signal CLK, and thus the rising edge of clock signal CLK determines the timing of definition of the output data, i.e., data appearing on an output pin. Therefore, it is not necessary to account for a timing margin for definition of the output data, which allows fast reading. Since I/O register 912 is used for reading data in synchronization with clock signal CLK, two clock cycles are required after application of external address signal Ade(A) at clock cycle #1 to output of corresponding memory cell data Q(A). Even in this case, the internal address signal is internally and successively produced every clock cycle for performing the memory cell selection and the reading of memory cell data. Therefore, data can be read every clock cycle after these operations, so that fast access can be performed.

Burst address counter 906 is used and has the count value changed to change the internal address signal. Therefore, it is not necessary to change and set external address signal Ade every clock cycle. Therefore, it is not necessary to drive the address signal line outside the BSRAM every clock cycle, but the operation of internally updating internal address signal Adi is merely performed so that the internal address signal can be rapidly produced every clock cycle. An external address signal line has a large load so that it requires a large current consumption for driving thereof, and its changing speed is limited. Therefore, it is possible to provide a storage device which can achieve fast data transfer.

FIG. 29 schematically shows structures of the array and the data read/write portion in the BSRAM shown in FIG. 27. In FIG. 29, memory array 900 is divided into memory sub-arrays MA#0, MA#1, MA#2 and MA#3 each having a plurality of static memory cells arranged in rows and columns. These memory sub-arrays MA#0–MA#3, of which structures will be described later in detail, include a main word line MWL extending over memory sub-arrays MA#0–MA#3 and local word lines each arranged in only one of the memory sub-arrays and corresponding to the main word line.

Memory select circuit 908 includes a block decoder 908a which decodes a block address signal ADz included in internal address signal Adi, and generates a block select signal designating one of memory sub-arrays MA#0–MA#3, a global row decoder 908b which decodes a row address signal Adx included in internal address signal Adi, and generates a signal designating a row in memory sub-arrays MA#0–MA#3, and a column decoder 908c which is provided commonly to memory sub-arrays MA#0–MA#3 and decodes a column address signal Ady included in internal address signal Adi and generates a column select signal selecting a column in memory sub-arrays MA#0–MA#3.

The signal generated from global row decoder 908b is transmitted onto main word line MWL extending over memory sub-arrays MA#0–MA#3. Block decoder 908a decodes block address signal Adz to drive one of block select signals BS0–BS3 to the active state and thereby designates one of memory sub-arrays MA#0–MA#3. Memory sub-arrays MA#0–MA#3 are selected in accordance with block select signals BS0–BS3, and row selection is performed in the selected memory sub-array in accordance with the row select signal applied from global row decoder 908b. In the nonselected memory sub-arrays, each row is held in the nonselected state.

For memory sub-arrays MA#0–MA#3, there are provided array peripheral circuits 901a–901d, respectively, which select columns and perform writing and reading of internal data into and from selected memory cells. Each of these array peripheral circuits 901a–901d includes a column select gate for selecting a column in accordance with the column select signal from column decoder 908c, and a bit line load circuit for precharging and equalizing each bit line pair (column) in the corresponding one of memory sub-array MA#0–MA#3 to a predetermined potential.

Read/write circuit 910 includes local read/write circuits 910a–910d provided corresponding to memory sub-arrays MA#0–MA#3, respectively. Each of local read/write circuits 910a–910d is activated when the block select signal from block decoder 908a is active, to perform read/write of data to the memory cell on the column selected by the corresponding array peripheral circuit.

A main sense amplifier 910e is coupled commonly to the read circuits in local read/write circuits 910a–910d through a common data bus 911. In the data read operation, main sense amplifier 910e is activated to amplify the data read from the selected memory cell in the selected memory sub-array through the local read/write circuit.

Input/output register 912 includes an output register 912a which takes in the output signal of main sense amplifier 910e in synchronization with the clock signal (not shown), and an input register 912b which takes in the data applied in the data writing in synchronization with the clock signal (not shown), and transmits the same onto common data bus 911 in synchronization with the clock signal. An output buffer 913a buffers the data applied from output register 912a, and produces external read (output) data DQ. Input register 912b receives and stores the buffered external write data through input buffer 913b in the data writing.

The memory sub-array, array peripheral circuit and local read/write circuit form one memory block. The structure shown in FIG. 29 includes four memory blocks MB#0–MB#3, each having the same structure.

FIG. 30 shows more specifically the structure of memory block MB#0 shown in FIG. 29. In FIG. 30, memory block MB#0 includes a plurality of static memory cells MC arranged in rows and columns, a plurality of local word lines LWL00–LWL0m arranged corresponding to the rows of memory cells, respectively, and connected to the memory cells in the corresponding rows, and a plurality of bit line pairs BLP0–BLPn arranged corresponding to the columns of memory cells, respectively, and connected to memory cells MC in the corresponding columns. Local word lines LWL00–LWL0m extend in the row direction only within memory block MB#0, and are driven to the active state in accordance with the word line select signal from a local row decoder 920. Main word lines MWL0–MWL0m for transmitting the row select signal applied from global row decoder 908b are arranged corresponding to local word lines LWL00–LWL0m. Local row decoder 920 drives the local word line corresponding to the selected main word line to the selected state in accordance with block select signal BS0 and the row select signal transmitted onto the main word line from global row decoder 908b. Each of main word lines MWL0–MWLm is arranged commonly to memory blocks MB#0–MB#3 and extends over these memory blocks for transmitting the row select signal to the local row decoders included in memory blocks MB#0–MB#3.

Memory block MB#0 further includes bit line peripheral circuits BPH arranged corresponding to bit line pairs BLP0–BLPn, respectively, and a local data bus LIO0 coupled to the addressed column, i.e., selected column through bit line peripheral circuit BPH. Each bit line peripheral circuit BPH includes an I/O gate for receiving corresponding one of column select signals Y0–Yn from column decoder 908c to electrically connect the bit line pair corresponding to the selected column to local data bus LIO0, and a bit line load circuit for precharging corresponding one of bit line pairs BLP0–BLPn to a predetermined potential during standby. Column select signals Y0–Yn from column decoder 908c are commonly applied to memory blocks MB#0–MB#3.

Memory block MB#0 further includes a local sense amplifier 910aa which is activated, when a local sense amplifier activating signal LSE0 is active, to amplify and transmit the signal potential on local data bus LIO0 onto common read data lines RDL and RDLB included in common data bus 911, and a write driver 910ab which amplifies the signal potential on a write data line WDL included in common data bus 911 to transmit complementary write data onto local data bus LIO0. Local sense amplifier activating signal LSE0 is selectively activated in accordance with block select signal BS0 in data reading operation. Write driver 910ab is activated in accordance with block select signal BS0 in data writing operation, although a path for this is not shown. Memory blocks MB#1–MB#3 likewise include local sense amplifiers and write drivers, respectively. Local data buses independent from each other are likewise arranged for each of these memory blocks. Common data bus 911 is arranged commonly to memory blocks MB#0–MB#3.

Read data bus lines RDL and RDLB are coupled to the main sense amplifier shown in FIG. 29.

Read data bus lines RDL and RDLB are coupled to the main sense amplifier shown in FIG. 29.

FIG. 31 shows a relationship between external address signal Ade and internal address signal Adi. As shown in FIG. 31, external address signal Ade includes a block address signal designating a memory block, a row address signal designating a row of memory cells in the memory block, and a column address signal designating a column in the memory block. These block address signal, row address signal and column address signal are multibit address signals. The least significant two bits of the column address signal are applied to the burst address counter, and the value thereof is successively updated every clock cycle. Therefore, internal address signal Adi designates the same block address and row address as external address signal Ade and, in the first cycle, external address signal Ade and internal address signal Adi designate the same column address.

In the next clock cycle, external address signal Ade and internal address signal Adi differ in value of the column address from each other. In the burst mode of selecting successively the memory cells in accordance with the burst address counter, therefore, different columns in the same memory block and the same memory cell row are successively selected. Description will now be given on an operation of successively reading out memory cell data of 4 bits in memory block MB#0 with reference to FIG. 32.

FIG. 32 shows, by way of example, an operation of successively reading out bit line pairs BLP0–BLP3 in memory block MB#0.

In clock cycle #0, internal address signal Adi is produced in accordance with externally applied address signal Ade, and local word line LWL00 corresponding to the addressed row in memory block MB#0 is driven to the selected state. Responsively, data stored in memory cells MC00–MC0n connected to the selected local word line LWL00 are read onto corresponding bit line pairs BLP0–BLPn, respectively.

In parallel with this operation of selecting the local word line, column decoder 908c performs the column selection, and column select signal Y0 is driven to the selected state. In accordance with column select signal Y0 driven to the selected state, the column select gate, which is included in bit line peripheral circuit BPH provided corresponding to bit line pair BLP0, is turned on to electrically connect bit line pair BLP0 to local data bus LIO0, and data in memory cell MC00 is read onto local data bus line pair LIO0. At this time, block select signal BS0 has already been driven to the H-level and thus the selected state. Then, local sense amplifier activating signal LSE0 is driven to the active state in accordance with activation of block select signal BS0 and local word line LWL00, and local sense amplifier 910aa amplifies and transmits the data on local data bus line LIO0 onto read data bus lines RDL and RDLB.

Then, main sense amplifier activating signal MSE is driven to the active state, and main sense amplifier 910a shown in FIG. 29 is activated so that the data in memory cell MC00 is amplified, and the amplified data is applied to output register 912a (FIG. 29) for storage therein in synchronization with clock signal CLK. The data stored in output register 912a is output via output buffer 913a in synchronization with clock signal CLK.

When a predetermined time elapses in clock cycle #0, local word line LWL00 and column select signal Y0 are both driven to the nonselected state. Block select signal BS0 maintains the selected state.

In next clock cycle #1, the burst address counter performs counting to update the least significant two bits of the column address, and column select signal Y1 from column decoder 908c is driven to the selected state. In this burst mode, the block address and row address do not change, so that local word line LWL00 is driven to the selected state again in clock cycle #1. Block select signal BS0 maintains the selected state and thus H-level for the burst period, i.e., a period for which data is continuously read out in response to one-time external address designation. In this state, data of one of memory cells MC00–MC0n connected to local word line LWL00, more specifically, data of memory cell MC01 connected to bit line pair BLP1 is transmitted onto local data bus line LIO0 through bit line peripheral circuit BPH. Then, local sense amplifier activating signal LSE0 is driven to the active state, and local sense amplifier 910aa is activated. Then, the main sense amplifier is activated, and data of memory cell MC01 is stored in the output register and will be read out through the output buffer in the next cycle.

In subsequent clock cycles #2 and #3, column select signals Y2 and Y3 are successively driven to the selected state, and data of memory cells MC02 and MC03 is successively read out. When expiration of the burst period is designated by a combination of states of external control signals, block select signal BS0 is driven to the nonselected state.

By internally and automatically producing the address signals, the memory cell selection can be performed fast, and fast data transfer can be implemented by reading and outputting data in synchronization with clock signal CLK.

FIG. 33 schematically shows a structure of a portion which generates a timing signal for selecting a row and a column. In FIG. 33, the timing signal generating portion includes a word line activating circuit 925 which is activated in response to activation of chip select signal /CS, to activate a word line activating signal WLE having a predetermined time width in synchronization with clock signal CLK, and a column activating circuit 927 which activates a column select line activating signal CLE having a predetermined time width in accordance with word line activating signal WLE. Word line activating signal WLE generated from word line activating circuit 925 is applied to global row decoder 908*b*. Column select line activating signal CLE generated from column activating circuit 927 is applied to column decoder 908*c*. Global row decoder 908*b* is kept active while word line activating signal WLE is active. Likewise, column decoder 908*c* is kept active while column select line CLE is active. Block decoder 908*a* statically decodes the block address signal received from the address register (FIG. 29). The address register resets the contents stored therein each time a new address is taken in response to activation of address strobe signal /ADS. Therefore, block decoder 908*a* is driven to the inactive or disabled state at the time of taking in the new address.

Word line activating signal WLE determines periods of selection (activation) of word lines MWL and LWL. Column select line activating signal CLE determines the active period of column select signal Y of column decoder 908*c*. Thus, word line activating signal WLE determines an active period TWLON of local word line LWL00 shown in FIG. 32, and column select line activating signal CLE determines an active period TYON of each of column select signals Y0–Y3.

In the operation of reading data from the memory cell, the local word line is selected, and then data of the selected memory cell is read onto the selected bit line pair and is subsequently transferred onto the local data bus line through the bit line peripheral circuit. Thereafter, the local sense amplifier is activated. In the data write operation, the write driver drives the local data bus line pair to the potential level depending on the write data, and the write data is transmitted onto the bit line pair through the bit line peripheral circuit and is written into the memory cell.

For correctly reading and writing data from and into the memory cell, it is necessary to properly perform the transmission of data between the bit line pair and the memory cell as well as the transmission of data between the bit line pair and the local data bus line pair. Therefore, active period TWLON of the local word line and active period TYON of the column select line must be longer than certain time periods, respectively. Active periods TWLON and TYON can be reduced only to limited extents when a high frequency operation is to be performed by reducing cycle time Tc of clock signal CLK in FIG. 32. Meanwhile, these active and inactive periods TWLON, TWLOFF, TYON and TYOFF satisfy the following relationship:

TWLON+TWLOFF≈Tc

TYON+TYOFF≈Tc

When cycle time Tc of clock signal CLK decreases, inactive period TYOFF of column select signal Y decreases relative to active period TYON of column select signal Y because the minimum length of active period TYON is predetermined. During the inactive period of the column select signal, the local data bus lines are precharged and equalized.

FIG. 34 schematically shows a structure of a precharge/equalize portion for the local data bus lines for one memory block. In FIG. 34, the precharge/equalize portion includes an AND circuit 930 receiving column select line activating signal CLE and a block select signal BSi (BS0–BS3), and a precharge/equalize circuit 932 which is activated to precharge and equalize bus lines LIOa and LIOb of local data bus line pair LIO to power supply voltage Vcc level when the output signal of AND circuit 930 is active. The precharge/equalize circuit 932 includes p-channel MOS transistors PTa and PTb provided for local data bus lines LIOa and LIOb, respectively, and receiving on their gates the output signal of AND circuit 930.

In each nonselected memory block, block select signal BSi is at L-level, and the output signal of AND circuit 930 is at L-level. Responsively, precharge/equalize circuit 932 is activated, and local data bus lines LIOa and LIOb are precharged to power supply voltage Vcc level. In the selected memory block, block select signal BSi is at H-level and thus active, and the output signal of AND circuit 930 attains L-level in synchronization with deactivation (L-level) of column select line activating signal CLE. Responsively, precharge/equalize circuit 932 precharges and equalizes local data bus lines LIOa and LIOb to power supply voltage Vcc level.

In the selected memory block, the precharge/equalize period of local data bus lines LIOa and LIOb is equal to inactive period TYOFF of column select line Y. If cycle time Tc of clock signal CLK decreases, and inactive period TYOFF of the column select line decreases, local data bus line pair LIO cannot be precharged and equalized sufficiently. This problem will now be described below with reference to FIG. 35.

FIG. 35 schematically shows change in potential on local data bus line pair LIO. Description will first be given on the case where cycle time Tc of clock signal CLK is long. At time T1, column select signal Y is driven to the active state, and the memory cell data is read onto local data bus line pair LIO after elapsing of time ta. In this state, the local sense amplifier is activated, and the memory cell data is read out. Upon elapsing of active period TYON, column select signal Y is set to the nonselected state, and column select activating signal CLE is deactivated, so that local data bus line pair LIO is precharged and equalized. If cycle time Tc is long, precharge/equalize circuit 932 shown in FIG. 34 restores local data bus line pair LIO to initial power supply voltage Vcc level.

Now, description will be given on the case where cycle time Tc of clock signal CLK is short. At time T2, column select activating signal CLE is activated, and column select signal Y is driven to the selected state. After elapsing of active period TYON, precharge/equalize circuit 932 shown in FIG. 34 equalizes in potential local data bus line pair LIO. If cycle time Tc is short, inactive period TYOFF of column select line and the precharge/equalize period of local data bus line pair LIO are short. Therefore, the precharge/equalize operation is ended at time T3 when the potential on local data bus line pair LIO is not yet restored to the original potential level.

In such an insufficiently precharged and equalized state, a next clock cycle starts, and the data of the selected memory cell is transmitted onto local data bus line pair LIO. It is now assumed that the data read in the cycle starting from time T3 is opposite in logic to the data of the memory cell selected in the cycle starting at time T2. In this case, a sufficiently large potential difference is not yet present on local data bus line pair LIO after time period ta from time T3 when the potential on the local data bus line at a lower potential of local data bus line pair LIO was driven to a high level, and a sufficiently large potential difference will appear after a time period tb from time T3. Therefore, the timing of activating the local sense amplifier must be set at or after elapsing of time period tb after time T3, which impedes fast reading. Due to the signal transmission delay at the main sense amplifier and output register, memory cell data cannot be externally output at the rising edge of clock signal CLK, and the fast reading cannot be performed.

This problem relating to the precharging and equalizing of the data bus line pair likewise arises in common data bus 911. Main sense amplifier 910e operates at each clock cycle, to transmit the data transmitted onto this common data bus to output register 912a (see FIG. 29). If cycle time Tc of clock signal CLK is short and a high frequency operation is to be performed, read data bus lines RDL and RDLB (see FIG. 30) included in common data bus 911 cannot be precharged and equalized sufficiently, and accurate reading or fast reading of the data is impossible. In this case, it is necessary to delay the timing of activating main sense amplifier activating signal MSE shown in FIG. 32. In this case, the timing of definition of the data taken into the output register is delayed so that the read data to be output through the output buffer is not made definite in accordance with the timing of rising of clock signal CLK, and data reading cannot be performed accurately.

More specifically, as shown in FIG. 36, if local sense amplifier activating signal LSE and main sense amplifier activating signal MSE are activated in accordance with delayed timing for reliably performing the precharge/equalize of the internal data bus lines, the timing of definition of the output signal of output register 912a is delayed. Therefore, it is impossible to ensure a sufficiently long setup time (with respect to clock signal CLK) for external read data DQ supplied from output buffer 913a, which in turn buffers the output signal of output register 912a for outputting. This results in a problem that data reading cannot be performed correctly.

SUMMARY OF THE INVENTION

An object of the invention is to provide a synchronous semiconductor memory device capable of fast data reading.

Another object of the invention is to provide a synchronous semiconductor memory device which can precharge and equalize an internal data bus with a margin even in a fast operation.

Still another object of the invention is to provide a synchronous semiconductor memory device allowing fast and accurate reading of data in a burst mode.

Briefly stating, a synchronous semiconductor memory device according to the invention is configured to successively activate, in a predetermined sequence, a plurality of memory array blocks in respective clock cycles in a burst mode operation.

Since different array blocks are selected in respective clock cycles, each array block which is driven to the selected state is held in the nonselected state in the next clock cycle. By utilizing this time period, an internal local data bus line can be precharged and equalized with a margin. Accordingly, the internal data bus line can be accurately precharged and equalized with a margin even if a cycle time of a clock signal is short, and it is not necessary to delay activation timing of a local sense amplifier, which allows fast reading.

In particular, the output signal of the burst address counter can be used as a block address for an array block select signal, whereby such an operation can be performed merely by changing address allocation without significantly modifying an internal structure that different array blocks are set to the selected state in respective clock cycles in the burst mode operation.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 15 shows an example of a structure of a circuit for precharging and equalizing a common data read bus shown in FIG. 5;

FIG. 16 is a timing chart representing an operation of the precharge/equalize circuit shown in FIG. 15;

FIG. 17 shows input/output bits of a burst address counter;

FIG. 18A shows a change sequence of internal address signal bits in an interleaved burst mode of the burst address counter shown in FIG. 17, and FIG. 18B shows a sequence of selecting memory blocks in this interleaved burst mode;

DESCRIPTION OF THE PREFERRED EMBODIMENTS

[Conceptual Structure]

Figure 1:
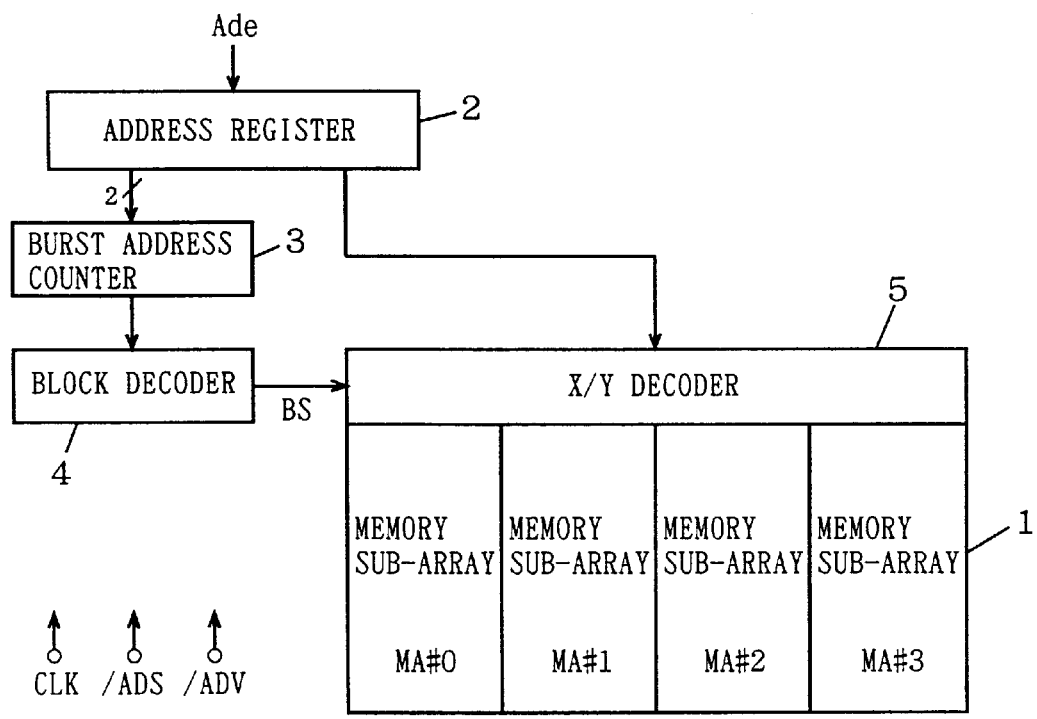
FIG. 1 shows a conceptual structure of a synchronous semiconductor memory device according to the invention.

FIG. 1 shows a conceptual structure of a synchronous semiconductor memory device according to an embodiment of the invention. In FIG. 1, the synchronous semiconductor memory device includes a memory array 1 divided into four memory sub-arrays MA#0–MA#3. Each of memory sub-arrays MA#0–MA#3 has a plurality of static memory cells arranged in rows and columns.

This synchronous semiconductor memory device further includes an address register 2 which takes in external address signal Ade in synchronization with the rising of clock signal CLK when address strobe signal /ADS is active, a burst address counter 3 which takes in predetermined column address signal bits (i.e., least significant 2 bits) of the address signal taken into address register 2, a block decoder 4 which receives, as a block address signal, the address signal bits from burst address counter 3, and an X/Y decoder 5 which decodes block select signal BS from block decoder 4 and remaining address signal bits (i.e., address signal bits other than the two bits applied to burst address counter 3: two bits designate the block address) from address register 2, and selects a memory cell in the memory sub-array designated by block select signal BS.

Burst address counter 3 updates, in a predetermined sequence, the value of the 2-bit address taken in synchronization with clock signal CLK when address advance signal /ADV is active. Address register 2 and burst address counter 3 correspond to address generating circuitry, and block decoder 4 and X/Y decoder 5 form a portion of selection/read circuitry.

Figure 2:
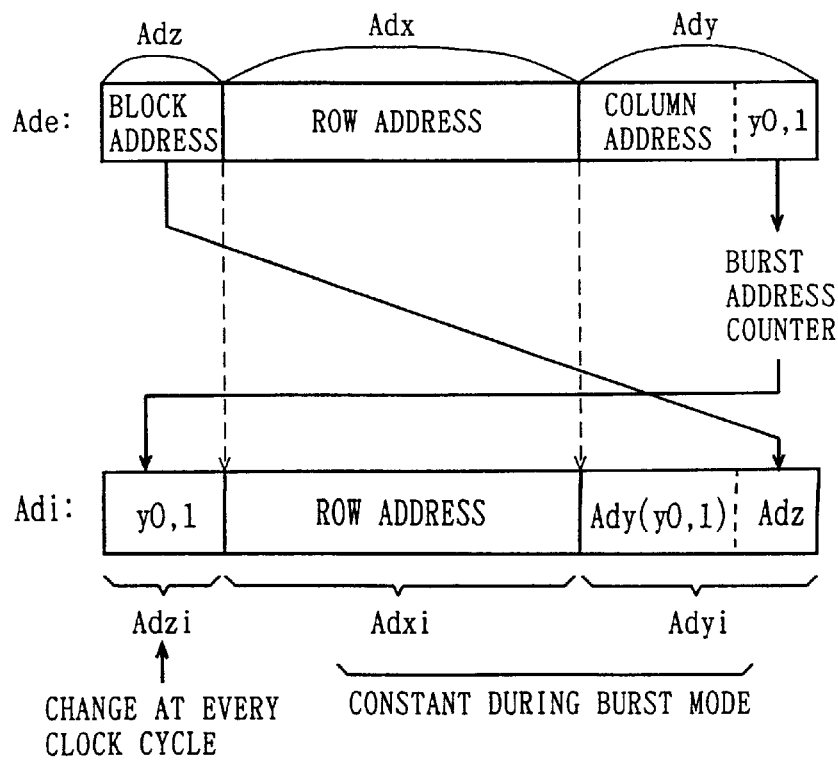
FIG. 2 shows a relationship between an external address signal and an internal address signal in the synchronous semiconductor memory device according to an embodiment of the invention.

FIG. 2 schematically shows structures of external and internal address signals. In FIG. 2, external address signal Ade includes a multibit address signal Adz, a multibit row address signal Adx and a multibit column address signal Ady. Block address signal Adz designates a memory sub-array. Row address signal Adx designates a row in a memory sub-array, and column address signal Ady designates a column in a memory sub-array. The predetermined bits, i.e., least significant two bits y0 and y1 of column address signal Ady are applied to the burst address counter.

The burst address counter successively updates, in a predetermined sequence, the values of two bits y0 and y1 of the column address signal in the burst mode operation. In this embodiment, the operation in the burst mode means an operation of internally producing an address signal in synchronization with the clock signal with externally applied address signal Ade used as a leading address, and selecting a memory cell.

Internal address signal Adi has 2-bit address y0 and y1 generated from the burst address counter, as a block address, and also has row address signal Adx as internal row address signal Adx. Internal column address signal Ady has remaining bits Ady(y0, 1) of column address signal Ady and block address signal Adz of external address signal Ade. Block address signal Adz is located at the position of 2-bit address y0 and y1. Since the output signal of this burst address counter changes in synchronization with clock signal CLK during the burst mode, block address signal Adzi of internal address signal Adi changes every clock cycle. Meanwhile, the remaining address signal bits have been taken into address register 2 and do not change. Therefore, internal row address signal Adxi and internal column address signal Adyi are constant during the burst mode. During this burst mode, memory sub-arrays MA#0–MA#3 are successively selected in a predetermined sequence.

Figure 3A:
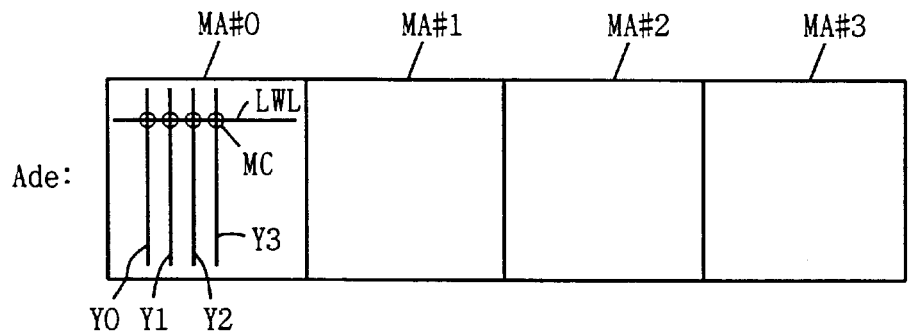
FIG. 3A shows a position of a memory cell specified by an external address signal.
Figure 3B:
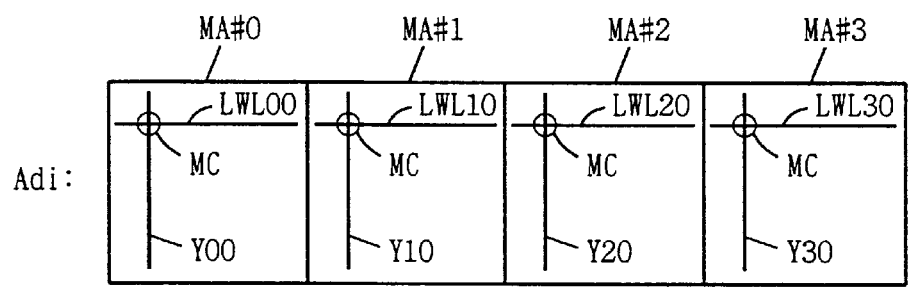
FIG. 3B shows a position of a memory cell selected in accordance with an internal address signal.

FIGS. 3A and 3B show arrangements of memory cells MC designated by external address signal Ade and internal address signal Adi, respectively. As shown in FIG. 3A, four columns Y0, Y1, Y2 and Y3 are successively selected, e.g., in memory array MA#0 during the burst mode, viewed with respect to external address signal Ade. Therefore, memory cells MC which are connected to the same local word line LWL and are arranged in different columns are successively selected.

Viewed with respect to internal address signal Adi, as shown in FIG. 3B, memory cells MC arranged corresponding to crossing points, where local word lines LWL00, LWL10, LWL20 and LWL30 at the same row cross column select lines Y00, Y10, Y20 and Y30 in memory sub-arrays MA#0–MA#3, at the same column respectively, are successively selected. Since internal row address signal Adxi and internal column address signal Adyi do not change during the burst mode, the memory cells arranged at the positions defined by the same row and the same column in the respective memory sub-arrays MA#0–MA#3 are successively selected.

In the burst mode, the following advantage can be achieved by driving the memory sub-arrays to the selected state in a predetermined sequence.

Figure 4:
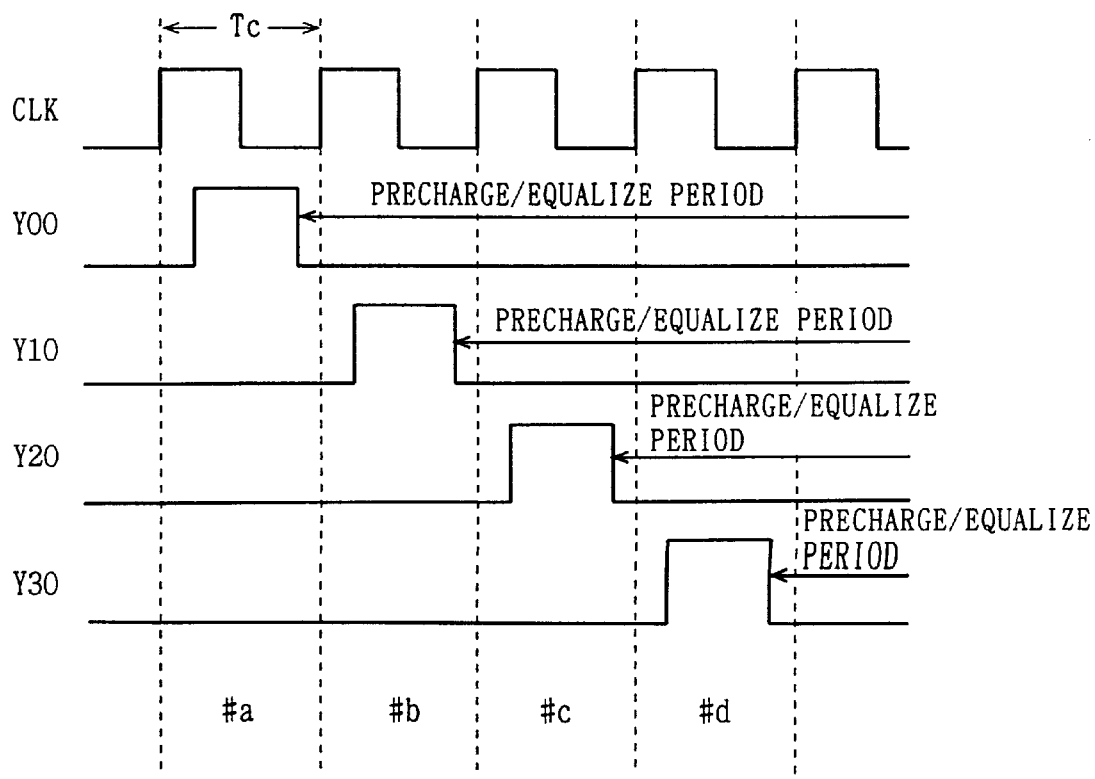
FIG. 4 is a timing chart representing an operation of the synchronous semiconductor memory device shown in FIG. 1.

FIG. 4 is a timing chart representing the column select operation in FIG. 3B. In a clock cycle #a, column select line Y00 for memory sub-array MA#0 is driven to the selected state, and responsively data of memory cell MC is amplified by a local sense amplifier (not shown) and is read out. In a next clock cycle #b, a column select line Y10 is driven to the selected state in another memory block MA#1, and the local sense amplifier provided corresponding to this memory sub-array #1 is activated. Thereafter, column select line Y20 for memory sub-array MA#2 and column select line Y30 for memory sub-array MA#3 are driven to the selected state in clock cycles #c and #d, respectively.

The local sense amplifiers provided corresponding to memory sub-arrays MA#2 and MA#3 are activated in clock cycles #c and #d, respectively. Local data buses are provided for memory sub-arrays MA#0–MA#3, respectively. The precharge/equalize period for a local data bus starts after the operation of selecting the column in the corresponding sub-array is completed. Thus, the local data buses corresponding to column select lines Y00, Y10, Y20 and Y30 are precharged and equalized when these column select signals are made inactive, respectively. Therefore, it is possible to increase sufficiently the precharge/equalize period for the local data bus in each of memory sub-arrays MA#0–MA#3 even if clock signal CLK has a short cycle time Tc, and these local data buses can be accurately precharged and equalized to the original potential level. Accordingly, it is not necessary to delay the activation timing of the local sense amplifier, and fast and accurate data reading can be performed even in the fast operation.

[Embodiment 1]

Figure 5:
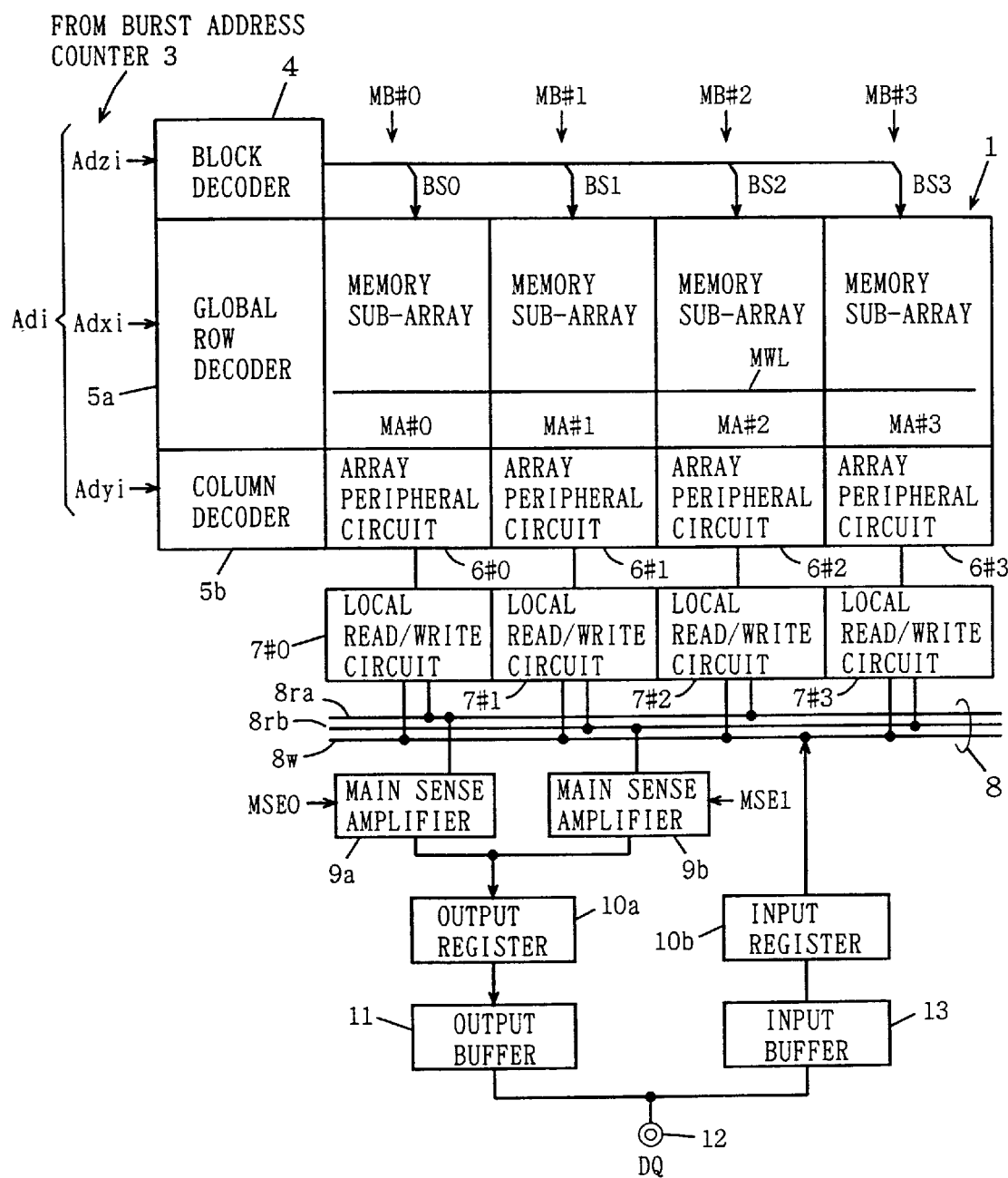
FIG. 5 schematically shows a structure of a main portion of a synchronous semiconductor memory device according to an embodiment 1 of the invention.

FIG. 5 schematically shows a structure of a main portion of a synchronous semiconductor memory device according to an embodiment 1 of the invention. In FIG. 5, memory array 1 is divided into four memory sub-arrays MA#0, MA#1, MA#2 and MA#3 similarly to the structure shown in FIG. 1. Commonly to memory sub-arrays MA#0–MA#3, there are arranged global row decoder 5a receiving internal row address signal Adxi from the address register shown in FIG. 1, and column decoder 5b receiving internal column address signal Adyi. Global row decoder 5a transmits a row select signal onto a main word line MWL provided commonly to memory sub-arrays MA#0–MA#3. Each of memory sub-arrays MA#0–MA#3 is provided with local word lines corresponding to main word lines MWL and also to the rows of memory cells, respectively.

Array peripheral circuits 6#0–6#3 are provided for memory sub-arrays MA#0–MA#3, respectively. These array peripheral circuits 6#0–6#3 include column select gates for selecting the columns in corresponding memory sub-arrays MA#0–MA#3 in accordance with the column select signal from column decoder 5b, respectively, bit line load circuits for precharging and equalizing the bit line pairs arranged corresponding to the columns in corresponding memory sub-arrays MA#0–MA#3 to the predetermined potential, respectively.

Selected columns in memory sub-arrays MA#0–MA#3 are coupled to local read/write circuits 7#0–7#3 through corresponding array peripheral circuits 6#0–6#3, respectively. Each of local read/write circuits 7#0–7#3 includes a write driver activated in response to the block select signal from block decoder 4 to write data into the selected column in the corresponding memory sub-array through the corresponding array peripheral circuit, and a local sense amplifier for reading out data of the selected memory cell.

A common data bus 8 is arranged commonly to local read/write circuits 7#0–7#3. Common data bus 8 includes a common read data bus 8ra provided for even-numbered memory sub-arrays MA#0 and MA#2, a common read data bus 8rb provided for odd-numbered memory sub-arrays MA#1 and MA#3, and a write data bus 8w provided commonly to memory sub-arrays MA#0–MA#3. In connection with the read data buses, memory sub-arrays MA#0–MA#3 are divided into a group of the even-numbered memory sub-arrays and a group of the odd-numbered memory sub-arrays.

Common read data bus 8ra is coupled to a main sense amplifier 9a which is activated in response to a main sense amplifier activating signal MSE0. Common read data bus 8rb is coupled to a main sense amplifier 9b which is activated in response to a main sense amplifier activating signal MSE1. Both main sense amplifiers 9a and 9b are commonly coupled to an output register 10a. Output register 10a takes in and latches the output signal of main sense amplifier 9a or 9b in synchronization with a clock signal (not shown). The output data of output register 10a is applied to a data input/output terminal 12 through an output buffer 11.

For data I/O terminal 12, there is provided an input buffer 13 which buffers externally supplied data in the data write operation. The signal from input buffer 13 is applied to an input register 10b which takes in the applied signal in synchronization with the clock signal in the data write operation. The write data taken into input register 10b is applied to common write data bus 8w.

Block decoder 4 receives address signal Adzi from burst address counter 3. Therefore, memory sub-arrays MA#0–MA#3 are successively selected in a predetermined sequence at successive clock cycles. Array peripheral circuits 6#0–6#3 couple the addressed columns to corresponding local read/write circuits 7#0–7#3, respectively in accordance with the column select signal from column decoder 5b. Local read/write circuit 7#0–7#3 are selectively activated in accordance with the local sense amplifier activating signal and the block select signal from block decoder 4 during the data reading.

When the even-numbered memory sub-arrays and odd-numbered memory sub-arrays are alternately driven to the selected state, even-numbered and odd-numbered local read/write circuits 7#0–7#3 are alternately activated. Therefore, common read data bus 8ra and common read data bus 8rb are alternately supplied with data read from the memory cell every clock cycle. Thus, each of common read data buses 8ra and 8rb is supplied with read data every other clock cycle. Accordingly, these common read data buses can be precharged for sufficiently long periods.

Main sense amplifiers 9a and 9b are driven to the selected state in accordance with the activated local read/write circuit, and are activated alternately. Therefore, the operation cycle time of each of main sense amplifiers 9a and 9b is double the cycle time of the clock signal so that amplification of the data on common data bus 8a can always be performed with a margin.

Common read data buses 8ra and 8rb are reliably precharged and equalized to the predetermined potential even when the operation is performed in accordance with a fast clock signal. Therefore, it is not necessary to delay the operation start timing for main sense amplifiers 9a and 9b so that fast reading can be achieved. Output register 10a takes in the data, which is applied alternately from main sense amplifiers 9a and 9b every clock cycle, in synchronization with the clock signal, and applies the same to output buffer 11.

Figure 6:
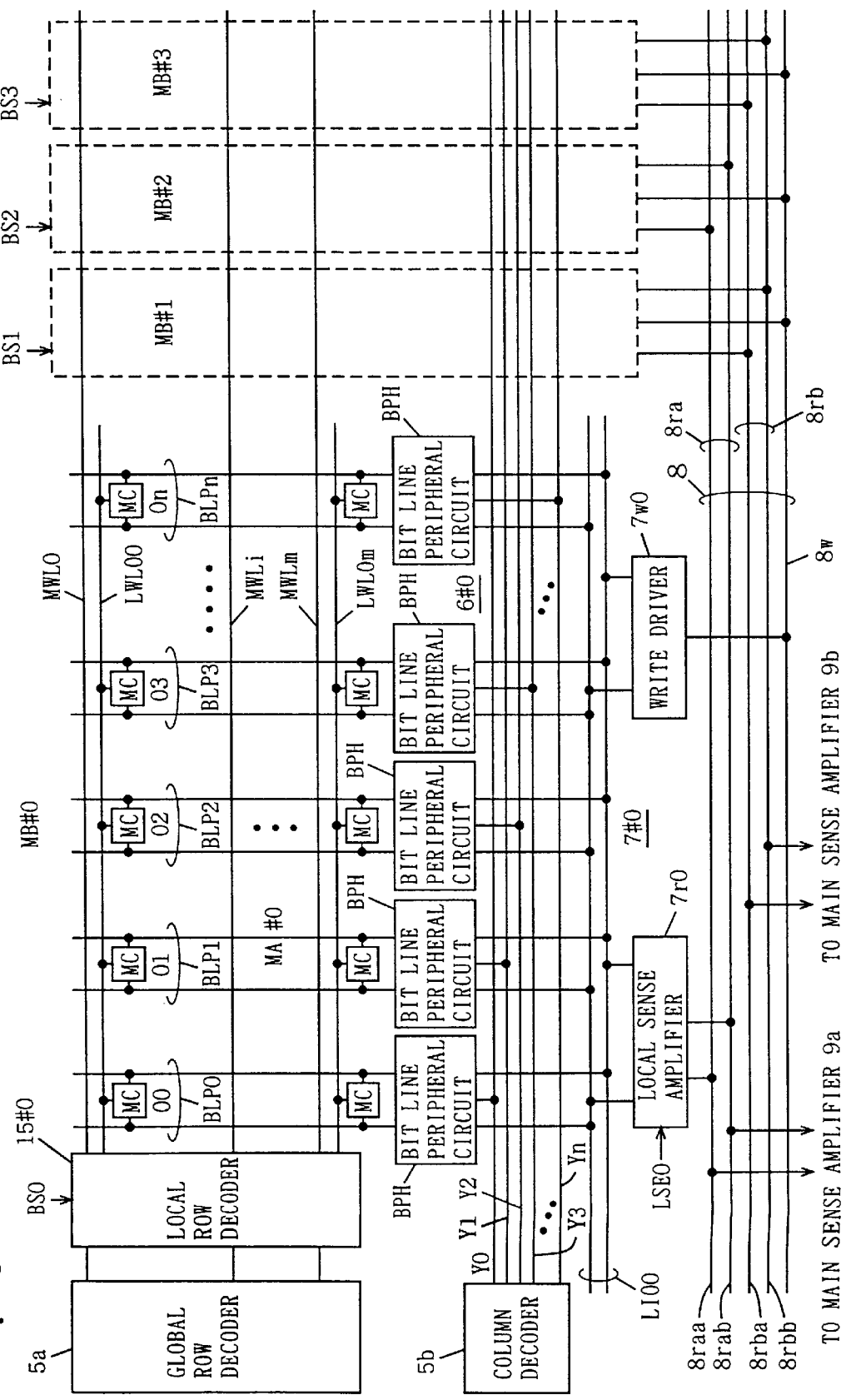
FIG. 6 shows more specifically structures of a memory block and a local read/write circuit shown in FIG. 5.

FIG. 6 shows more specifically the structures of the memory sub-array and local read/write circuit shown in FIG.

5. FIG. 6 shows the structures of memory sub-array MA#0, array peripheral circuit 6#0 and local read/write circuit 7#0. This synchronous semiconductor memory device includes four memory blocks MB#0–MB#3. Memory blocks MB#0–MB#3 have the same structures, and FIG. 6 shows the structure of memory block MB#0 as a representative. Memory block MB#0 includes memory sub-array MA#0, array peripheral circuit 6#0, local read/write circuit 7#0 and a local row decoder 15#0.

Memory sub-array MA#0 includes a plurality of static memory cells MC arranged in rows and columns, a plurality of local word lines LWL00–LWL0m arranged corresponding to the rows of memory cells MC and connected to memory cells MC in the corresponding rows, respectively, and a plurality of bit line pairs BLP0–BLPn arranged corresponding to the columns of memory cells MC and connected to memory cells MC in the corresponding columns, respectively. Corresponding to local word lines LWL00–LWL0m, there are arranged main word lines MWL0–MWLm for transmitting the row select signal from global row decoder 5a. Each of main word lines MWL0–MWLm extends over memory blocks MB#0–MB#3, and is commonly used by memory blocks MB#0–MB#3.

Local row decoder 15#0 is activated when block select signal BS0 from block decoder 4 (see FIG. 5) is active, to transmit a word line drive signal, which in turn is transmitted onto the main word line from global row decoder 5a, onto the corresponding local word line. Therefore, only the local word line arranged corresponding to the selected main word line is driven to the selected state. Local row decoder 15#0 is arranged corresponding to each local word line, and is formed of, e.g., an AND circuit receiving a signal potential on the corresponding main word line and block select signal BS0.

Array peripheral circuit 6#0 includes bit line peripheral circuits BPH arranged corresponding to bit line pairs BLP0–BLPn, respectively and including column select gates for connecting the corresponding bit line pairs to local data bus line pair LIO0 in accordance with column select signals Y0–Yn from column decoder 5b as well as bit line load circuits, respectively. The bit line load circuit precharges and equalizes the corresponding bit line pair to the predetermined potential. Column select signals Y0–Yn from column decoder 5b are commonly applied to memory blocks MB#0–MB#3. Local data bus line pair LIO0 extends only within memory block MB#0, and is electrically coupled to a bit line pair arranged corresponding to a selected column via bit line peripheral circuit BPH.

Common data bus 8 includes common read data bus 8ra provided for memory blocks MB#0 and MB#2, common read data bus 8rb provided for memory blocks MB#1 and MB#3, and common write data bus 8w provided commonly to memory blocks MB#0–MB#3. Common read data bus 8ra includes read data bus lines 8raa and 8rab for transmitting complementary data, i.e., two data complementary to each other. Common read data bus 8rb includes read data bus lines B*rba* and 8rbb for transmitting complementary data.

Local read/write circuit 7#0 includes a local sense amplifier 7ra which is activated in response to activation of local sense amplifier activating signal LSE0, to differentially amplify the signal potentials on local data bus line pair LIO0 for transmission onto common read data bus 8ra, and a write driver 7w0 for amplifying the signal potential on common write data bus 8w for transmission onto local read data bus line pair LIO0.

Figure 7:
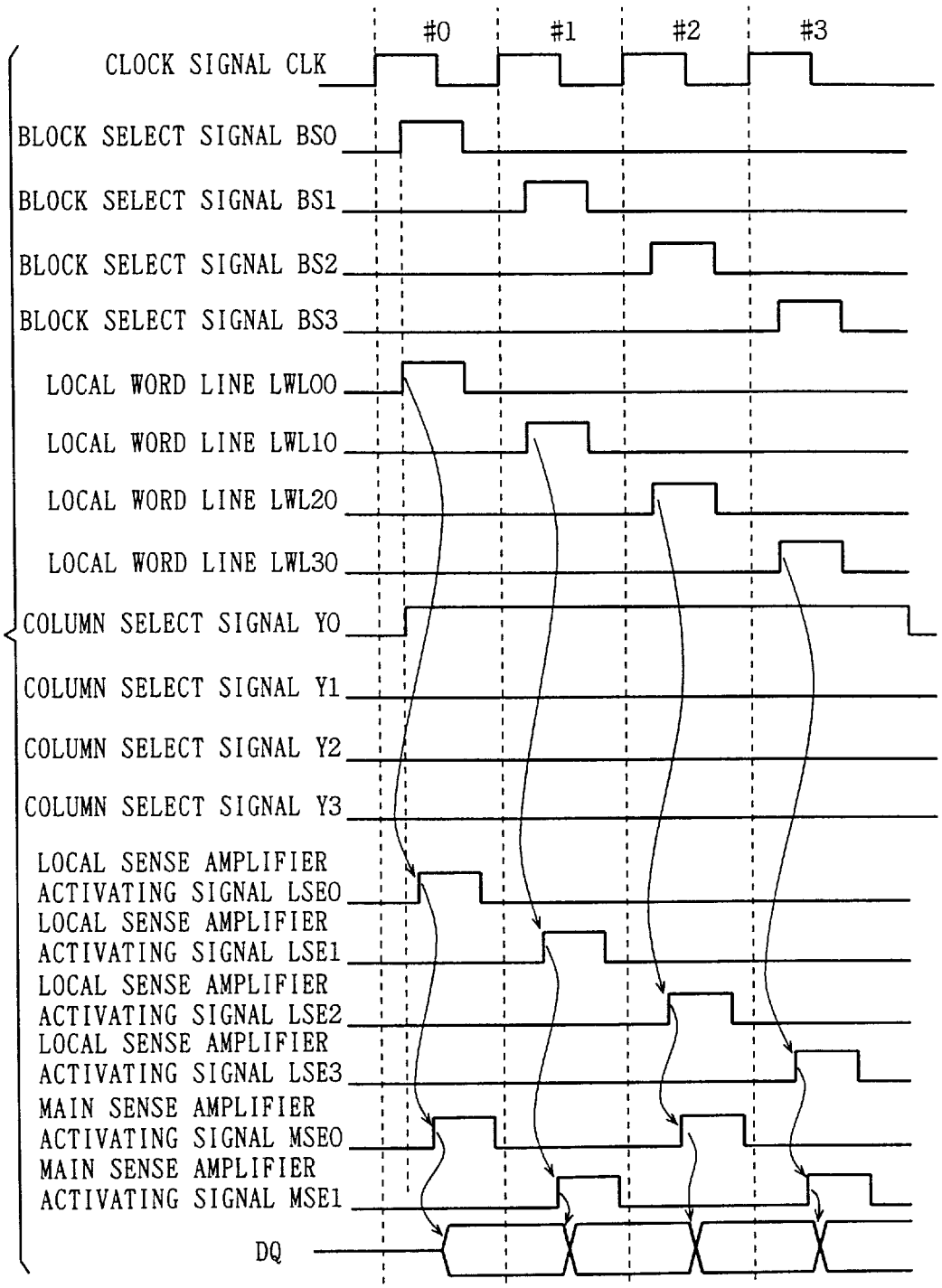
FIG. 7 is a timing chart representing an operation of the synchronous semiconductor memory device shown in FIGS. 5 and 6.

Common read data bus 8ra is coupled to the local sense amplifiers in memory blocks MB#0 and MB#2, and common read data bus 8rb is coupled to the local sense amplifiers in memory blocks MB#1 and MB#3. Write data bus 8w is coupled commonly to the write drivers in memory blocks MB#0–MB#3. Read data bus 8ra is coupled to main sense amplifier 9a, and read data bus 8rb is coupled to main sense amplifier 9b. The operation of the synchronous semiconductor memory device shown in FIGS. 5 and 6 for reading the data will be described below with reference to a timing chart of FIG. 7.

In the following description, it is assumed that an externally supplied block address signal is set to designate memory block MB#0, and an externally supplied column address signal is set to activate successively and sequentially column select signals Y0, Y1, Y2 and Y3 during the burst mode.

In clock cycle #0, the internal address signal is produced in accordance with the address signal which was taken in according to the address strobe signal in the last clock cycle, and block decoder 4 drives block select signal BS0 to H-level according to the externally applied address signal for a predetermined period. Global row decoder 5a decodes applied internal row address signal Adxi, and local row decoder 15#0 in memory block MB#0 drives local word line LWL00 to the selected state in accordance with the row select signal applied from global row decoder 5a. Column decoder 5b drives column select signal Y0 to the H-level or the selected state in accordance with the block address signal (external). Column select signal Y0 from column decoder 5b is applied commonly to memory blocks MB#0–MB#3. In memory blocks MB#1–MB#3, however, block select signals BS1–BS3 are inactive at L-level, and all the local word lines are nonselected and kept in the precharged state. Therefore, no problem arises.

In memory block MB#0, bit line pair BL00 is electrically connected to local data bus line pair LIO0 via bit line peripheral circuit BPH in accordance with column select signal Y0. When the signal potential difference on local data bus line pair LIO0 increases, local sense amplifier activating signal LSE0 is activated so that local sense amplifier 7r0 amplifies differentially the signal potentials on local data bus line pair LIO0 for transmission onto common data bus lines 8raa and B*rab*. Then, main sense amplifier 9a shown in FIG. 5 is activated in response to main sense amplifier activating signal MSE0, to amplify the data received from local sense amplifier 7ra for application to output register 10a. The output register takes in the applied data, and then transmits the same to data I/O terminal 12 through output buffer 11.

In the next clock cycle #1, burst address counter performs counting, so that block address signal Adzi applied to block decoder 4 changes in value, and block select signal BS1 is driven to the selected state. Memory block MB#1 is selected, and corresponding local word line LWL10 in the memory sub-array MA#1 is driven to the selected state. Local word line LWL10 thus selected is arranged corresponding to the same main word line MWL0 as that for local word line LWL00. Since the row address signal does not change, global row decoder 5a repetitively drives the same main word line MWL0 to the selected state.

Then, activating signal LSE1 for the local sense amplifier provided in memory block MB#1 is activated in accordance with block select signal BS1, and corresponding data is transmitted onto common read data bus lines 8rba and 8rbb. This memory block MB#1 is an odd-numbered memory block, so that main sense amplifier 9b is activated in response to main sense amplifier activating signal MSE1 to amplify data read onto common read data buses 8*rb* (8*rba* and 8*rbb*) for application to output register 10*a*. In clock cycle #1, data amplified by main sense amplifier 9*b* is applied to data I/O terminal 12 via output buffer 11.

In the next clock cycle #2, the burst address counter performs counting again, so that block select signal BS2 from block decoder 4 is driven to the selected state, and memory block MB#2 is selected. In this case, global row decoder 5*a* drives the same main word line MWL0 to the selected state and, in memory block MB#2, corresponding local word line LWL20 is driven to the selected state. Then, the local sense amplifier provided corresponding to memory block MB#2 is activated in response to activation of activating signal LSE2, to transmit the data of the selected memory cell onto common read data bus 8*ra*. Memory block MB#2 is an even-numbered memory block, and main sense amplifier activating signal MSE0 is activated and further the memory cell data read from memory block MB#2 is amplified and applied to output register 10. Thereby, the data read from memory block MB#2 is output in clock cycle #2.

In clock cycle #3, the burst address counter performs the counting so that block select signal BS3 from block decoder 4 is driven to the selected state. Memory block MB#3 is selected, and local word line LWL30 is driven to the selected state. Then, in memory block MB#3, local sense amplifier activating signal LSE3 is activated, and the corresponding local sense amplifier performs the sensing operation to transmit the amplified data onto common read data bus 8*rb*. Main sense amplifier activating signal MSE1 is activated so that main sense amplifier 9*b* amplifies the applied data for transmission to output register 10*a*.

When the burst read mode is completed, the address register is reset, and column select signal Y0 is driven to the deselected state. End of the data read operation in this burst mode is specified, e.g., by setting address advance signal /ADV and address strobe signal /ADS to H-level, or by setting address advance signal /ADV and chip select signal /CS to H-level. Return to the standby state is specified by setting chip select signal /CS and address strobe signal /ADS to L-level. This is merely an example, and the return is generally specified by a combination of states of a plurality of chip select signals and a plurality of address strobe signals depending on a practically used synchronous semiconductor memory device.

As described above, the address signal of 2 bits generated from the burst address counter is utilized as the block select address. Thereby, memory blocks MB#0–MB#3 can be successively driven to the selected state during the burst mode. In this operation, the column select signal from the column decoder is held in the selected state during the burst period. This reduces a current consumption caused by charging and discharging the select signal.

The different memory blocks are driven to the selected state in respective clock cycles. Local data bus line pair LIO is precharged and equalized during the inactive state of the block select signal. Therefore, it is possible to acquire sufficiently long time for precharging the local data line pair, and it is not necessary to delay the timing for activating local sense amplifier activating signal LSE, which allows fast data reading.

The main sense amplifiers employed in the embodiment are two in number, each main sense amplifier operates only once every two clock cycles. Therefore, the common read data bus lines included in common data bus 8 can be precharged and equalized with a sufficient margin, and it is not necessary to delay the timing for activating main sense amplifier activating signals MSE (MSE0 and MSE1). Accordingly, data can be rapidly transferred to the output register, and data can be read accurately and rapidly.

Figure 8:
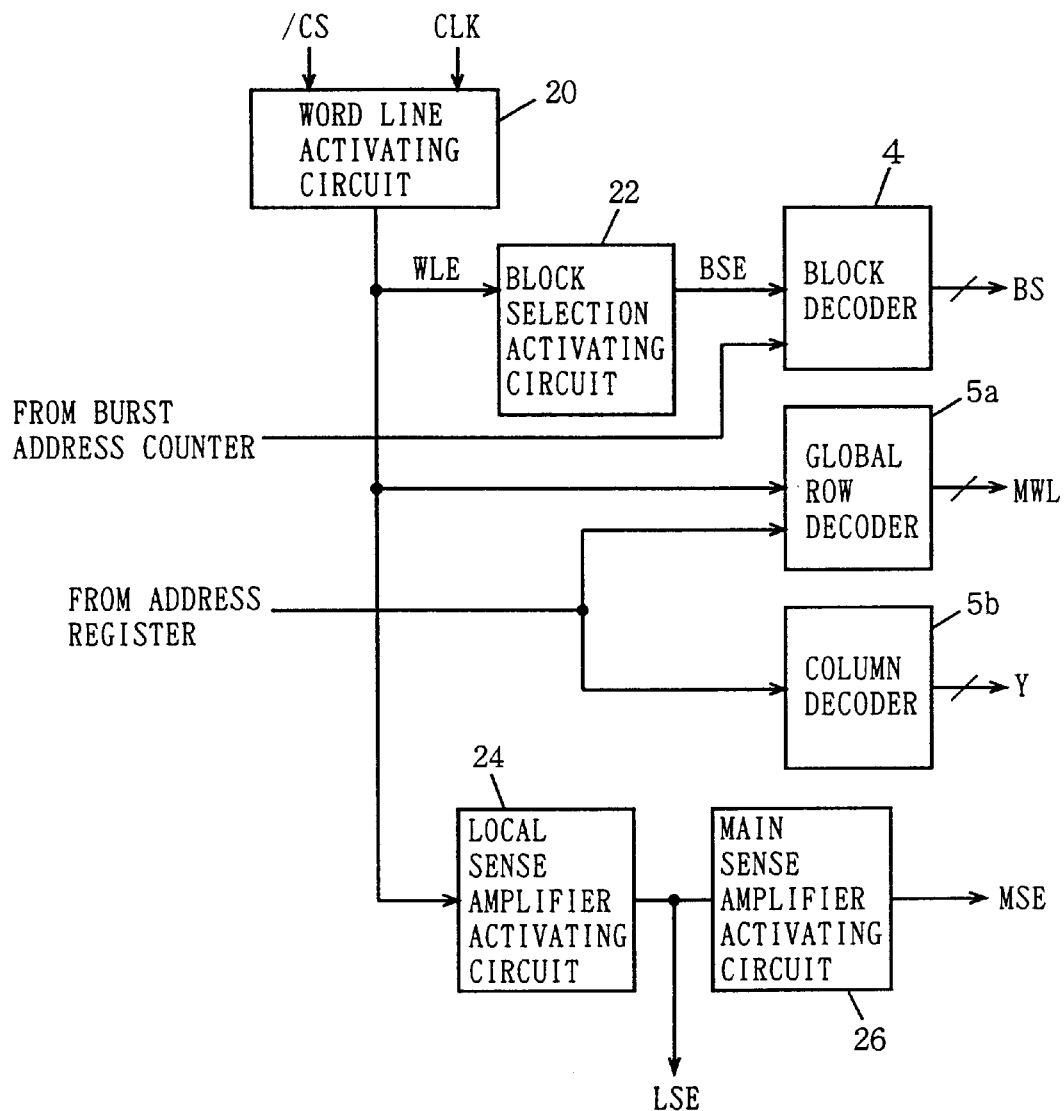
FIG. 8 schematically shows a structure of control signal generating circuitry in the synchronous semiconductor memory device shown in FIG. 5.

FIG. 8 schematically shows a structure of control signal generating circuitry. In FIG. 8, the control signal generating circuitry includes a word line activating circuit 20 for generating word line activating signal WLE having a predetermined time width in response to chip select signal /CS and clock signal CLK, a block selection activating circuit 22 for generating a block selection activating signal BSE having a predetermined width in response to word line activating signal WLE received from word line activating circuit 20, a local sense amplifier activating circuit 24 for generating local sense amplifier activating signal LSE having a predetermined time width in response to word line activating signal WLE, and a main sense amplifier activating circuit 26 for generating main sense amplifier activating signal MSE in response to local sense amplifier activating signal LSE.

Word line activating circuit 20 delays chip select signal /CS by one clock cycle, and drives word line activating signal WLE to the active state for a predetermined time in a clock cycle subsequent to activation of chip select signal /CS. This is because the row selection is internally performed based on the internal address signal generated with a delay of one clock cycle. Block select activating circuit 22 drives block select signal BSE to the active state in synchronization with activation of word line activating signal WLE. Block select signal BSE from block select activating circuit 22 is applied to block decoder 4. Block decoder 4 is activated when block select activating signal BSE is active, to decode the address signal received from the burst address counter for driving one of the block select signals BS corresponding to the addressed memory block to the active state.

Word line activating signal WLE is applied to global row decoder 5*a*. Column decoder 5*b* operates statically. These global row decoder 5*a* and column decoder 5*b* are supplied with the address signal from the address register. Therefore, global row decoder 5*a* performs decoding while word line activating signal WLE is active, to drive one of main word lines MWL corresponding to the addressed row to the selected state. Column decoder 5*b* operates statically to decode the internal column address signal received from the address register and hold column select signal Y corresponding to the addressed column in the selected state during this burst period. After completion of the burst operation mode, contents of the address register are reset.

Local sense amplifier activating circuit 24 drives local sense amplifier activating signal LSE to the active state after a certain time elapses since the local word line was driven to the selected state subsequently to activation of word line activating signal WLE. Main sense amplifier activating signal 26 drives main sense amplifier activating signal MSE to the active state after activation of local sense amplifier activating signal LSE.

As shown in FIG. 8, block decoder 4 decodes the address signal received from the burst address counter in accordance with block selection activating signal BSE every clock cycle, and successively activates the memory blocks in a predetermined sequence. A result of logical product of block select signal BS and local sense amplifier activating signal LSE is applied to the local sense amplifier provided in each memory block. Logical AND is taken of main sense amplifier activating signal MSE and a result of OR operation on the block select signals provided for the even-numbered memory blocks, and the logical product thus obtained forms signal MSE0 for activating the main sense amplifier provided for the even-numbered memory blocks. The logical product of main sense amplifier activating signal MSE and the logical sum of the block select signals for the odd-numbered memory blocks forms activating signal MSE1 for the main sense amplifier provided for the odd-numbered memory blocks.

The signal potential applied from global row decoder 5a onto each main word line MWL is ANDed in the local row decoder with the corresponding block select signal, and the local word lines are selectively driven to the active state in each memory block. The column select signal from column decoder 5b is applied commonly to the memory blocks, and the column selection is performed in each memory block.

Figure 9:
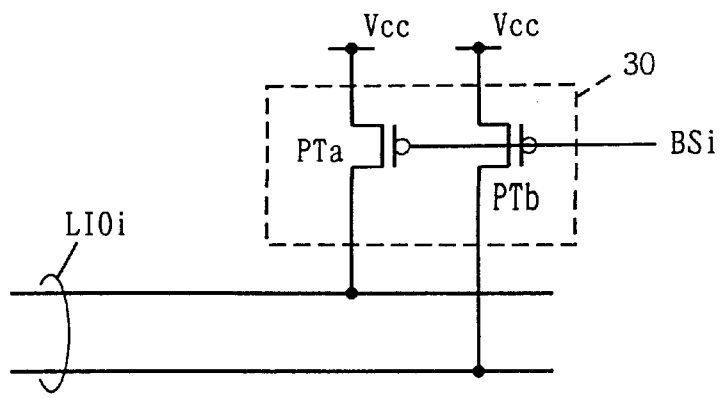
FIG. 9 shows an example of a precharge/equalize circuit of a local read data bus in the embodiment 1 of the invention.

FIG. 9 shows a structure of a portion performing precharge/equalize of the local data bus line pair. FIG. 9 shows only the precharge/equalize circuit for local data bus line pair LIOi provided for one memory block MB#i (i=0, 1, 2, 3). In FIG. 9, precharge/equalize circuit 30 includes p-channel MOS transistors PTa and PTb which are activated when block select signal BSi is inactive, to precharge the bus lines of local data bus line pair LIOi to the power supply voltage Vcc level, respectively. This precharge/equalize circuit 30 is deactivated only when corresponding memory block MB#i is selected to have the memory cell data therein read or written.

Figure 10:
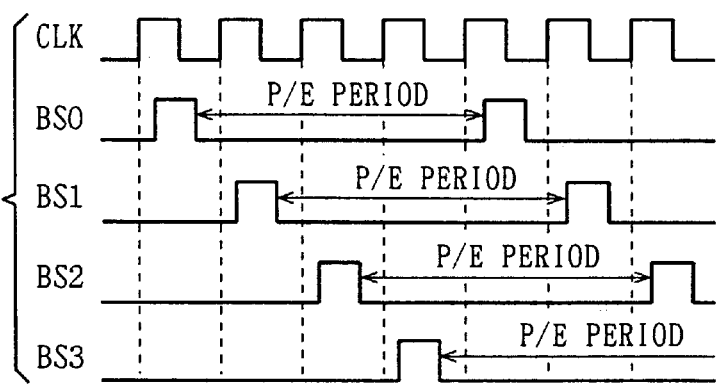
FIG. 10 is a timing chart representing an operation of the precharge/equalize circuit shown in FIG. 9.

FIG. 10 is a timing chart representation an operation of the precharge/equalize circuit shown in FIG. 9. FIG. 10 represents by way of example an operation in a case that addresses A and A+4 are applied in the burst mode. In this case, memory blocks MB#0–MB#3 are successively selected at respective clock cycles in accordance with block select signals BS0–BS3. Each of block select signals BS0–BS3 is activated once every four clock cycles, and is held inactive during the remaining three clock cycles. During these remaining three clock cycles, the precharge/equalize circuit 30 shown in FIG. 9 is activated to precharge corresponding local data bus line pair LIOi (i=0–3) to the predetermined potential at Vcc level. Accordingly, a sufficiently long precharge/equalize period (P/E period) of local data bus line pair LIOi can be ensured, and the local data bus line pair can be reliably precharged and equalized to the predetermined voltage level even if the cycle period of clock signal CLK is short.

[Modification of the Main Sense Amplifier Activating Circuit]

Figure 11:
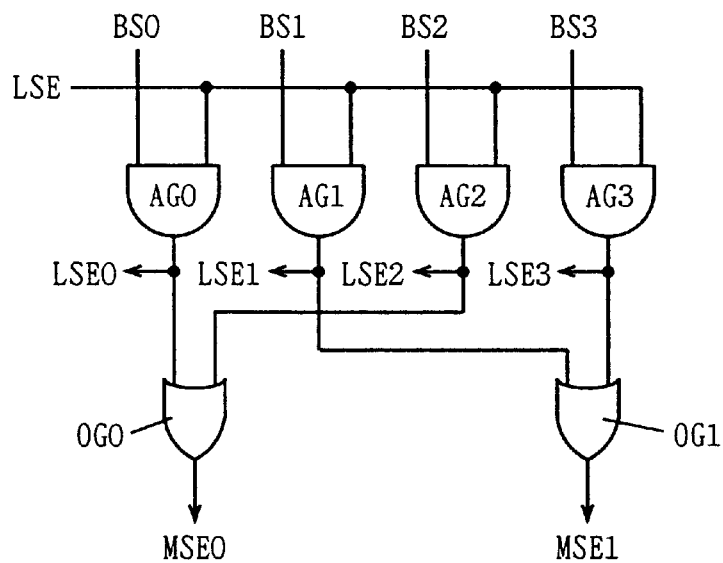
FIG. 11 shows a structure of a modification of a main sense amplifier activating circuit shown in FIG. 8.
Figure 12:
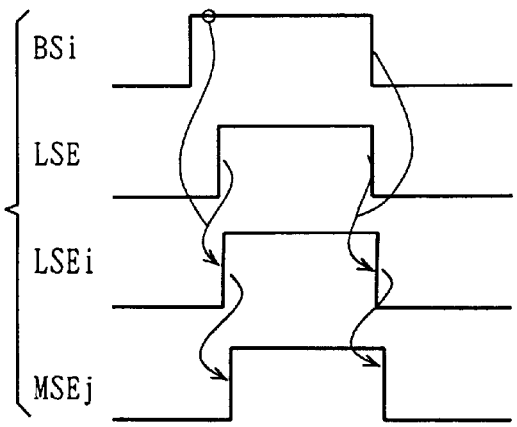
FIG. 12 is a signal waveform diagram representing an operation of the main sense amplifier activating circuit shown in FIG. 11.

FIG. 11 shows a structure of a modification of the main sense amplifier activating circuit shown in FIG. 8. In FIG. 11, the main sense amplifier activating circuit includes AND circuits AG0–AG3 provided for the memory blocks and receiving corresponding block select signals BS0–BS3 as well as local sense amplifier activating signal LSE, respectively, an OR circuit OG0 receiving the outputs of AND circuits AG0 and AG2 provided for the even-numbered memory blocks, respectively, and an OR circuits OG1 receiving the output signals of AND circuits AG1 and AG3 which are provided for the odd-numbered memory blocks, respectively. AND circuits AG0–AG3 generate local sense amplifier activating signals LSE0–LSE3 for the corresponding memory blocks, respectively. OR circuit OG0 generates main sense amplifier activating signal MSE0, and OR circuit OG1 generates main sense amplifier activating signal MSE1. An operation of the main sense amplifier activating circuit shown in FIG. 11 will be described below with reference to a signal waveform diagram of FIG. 12.

When block select signal BSi for memory block MB#i to be selected is activated, local sense amplifier activating signal LSE is activated after elapsing of a certain time required for the selected memory cell data to be read onto the local data bus line pair. In response to this activation of local sense amplifier activating signal LSE, local sense amplifier activating signal LSEi from AND circuit AGi (i=0, 1, 2 or 3) provided for selected memory block MB#i is activated, so that the local sense amplifier for selected memory block MB#i is activated. Subsequent to the activation of local sense amplifier activating signal LSEi, main sense 44 amplifier activating signal MSEj (j=0 or 1) from OR circuit OG0 or OG1 is activated. After the local sense amplifier is activated and performs the sensing, the corresponding main sense amplifier is activated. Therefore, the main sense amplifier is activated after the activation of the local sense amplifier, and the main sense amplifier performs the sensing operation after the output data of the local sense amplifier appears. Accordingly, the main sense amplifier can perform the operation of amplifying the data more reliably.

Figure 13:
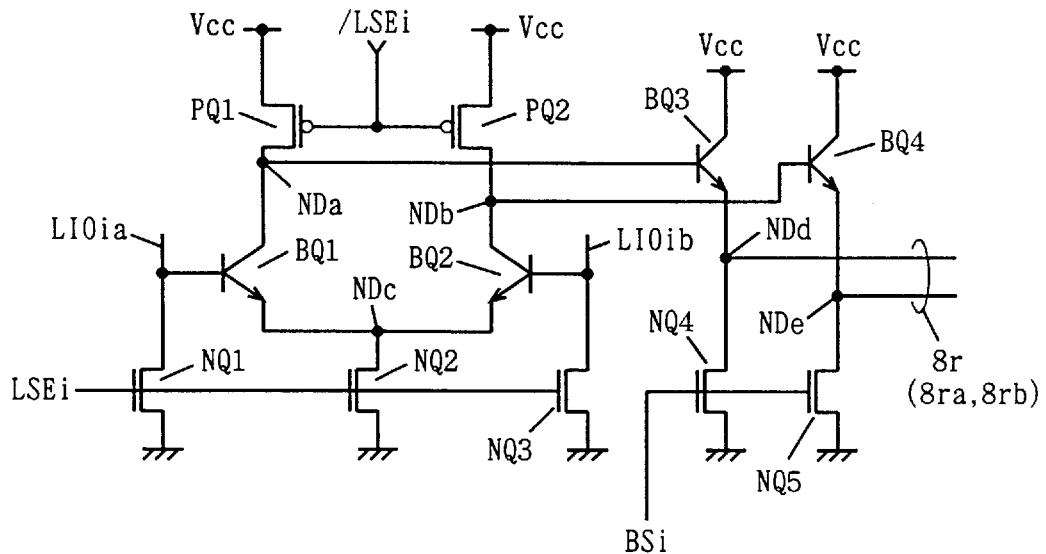
FIG. 13 shows an example of a structure of a local sense amplifier shown in FIG. 6.

FIG. 13 shows an example of a specific structure of the local sense amplifier. In FIG. 13, the local sense amplifier includes a p-channel MOS transistor PQ1 which is connected between the power supply node and a node NDa, and receives on its gate a complemental local sense amplifier activating signal /LSEi, a p-channel MOS transistor PQ2 which is connected between the power supply node and a node NDb, and receives on its gate complemental local sense amplifier activating signal /LSEi, an npn bipolar transistor BQ1 which has a collector connected to node NDa, an emitter connected to a node NDc and a base connected to local data bus line LIOia, an npn bipolar transistor BQ2 which has a collector connected to node NDb, an emitter connected to node NDc and a base connected to local data bus line LIOib, and an n-channel MOS transistor NQ2 which is connected between node NDc and the ground node, and receives local sense amplifier activating signal LSEi on its gate.

Local data bus lines LIOa and LIOb are provided with n-channel MOS transistors NQ1 and NQ3, which in turn are turned on in response to local sense amplifier activating signal LSEi, to electrically couple the local data bus lines LIOa and LIOb to the ground node, respectively.

The local sense amplifier further includes an npn bipolar transistor BQ3 which has a collector connected to the power supply node, an emitter connected to node NDb and a base connected to node NDa, an npn bipolar transistor BQ4 which has a collector connected to the power supply node, an emitter connected to a node NDe and a base connected to node NDb, an n-channel MOS transistor NQ4 which is connected between the emitter of bipolar transistor BQ3 and the ground node, and receives block select signal BSi on its gate, and an n-channel MOS transistor NQ5 which is connected between the emitter of bipolar transistor BQ4 and the ground node, and receives block select signal BSi on its gate. Nodes NDd and NDe are connected to the bus lines of common read data bus 8r, respectively. Common read data bus 8r corresponds to read data bus 8ra or 8ra shown in FIG. 5, depending on whether the memory block MB#i provided with this local sense amplifier is odd-numbered one or even-numbered one.

When block select signal BSi is at L-level and inactive, local sense amplifier activating signal LSEi is also inactive. In this state, all n-channel MOS transistors NQ1–NQ5 are off, and p-channel MOS transistors PQ1 and PQ2 are also off. Local data bus lines LIOia and LIOib are already precharged to the predetermined voltage level by a precharge/equalize circuit (not shown). Nodes NDa and NDb are electrically floated so that bipolar transistors BQ3 and BQ4 are not supplied with base currents, and maintain the off state. Nodes NDd and NDe are precharged and equalized to a predetermined voltage level by a precharge/ equalize circuit provided at common read data bus 8r.

When block select signal BSi is activated, MOS transistors NQ4 and NQ5 are turned on to lower slightly the potential levels on nodes NDd and NDe. Then, local sense amplifier activating signal LSEi is activated so that MOS transistors NQ1–NQ3 are turned on, and p-channel MOS transistors PQ1 and PQ2 are turned on. Thereby, current paths for bipolar transistors BQ1 and BQ2 are formed, and the operation of sensing (differentially amplifying) the voltages on local data bus lines LIOia and LIOib is performed.

The emitters of bipolar transistors BQ1 and BQ2 are both connected to node NDc. Therefore, the bipolar transistor which is connected to a bus line at a higher potential of local data bus lines LIOa and LIOb is turned on, and the other bipolar transistor is turned off. It is now assumed that the potential on local data bus line LIOia is higher than that on local data bus line LIOib. In this state, bipolar transistor BQ1 is turned on, and the current supplied from MOS transistor PQ1 is discharged through MOS transistor NQ2, and the potential level on node NDa lowers.

Meanwhile, bipolar transistor BQ2 is off, and node NDb is held at power supply voltage Vcc level in accordance with the current supplied from MOS transistor PQ2. Nodes NDa and NDb are connected to the bases of bipolar transistors BQ3 and BQ4, respectively. Bipolar transistors BQ3 and BQ4 operate in the emitter follower mode. Node NDd is held at a voltage level lower than the voltage level on node NDa by a base-emitter voltage Vbd of the bipolar transistor, and node NDe is held at the voltage level which is lower than that on node NDb by a base-emitter voltage Vbe of bipolar transistor BQ4. Therefore, the voltage level on node NDe exceeds the voltage level on node NDd, and data of the selected memory cell is read onto common read data bus 8r. In the nonselected memory block, block select signal BSi and local sense amplifier activating signal LSEi are inactive, and bipolar transistors BQ3 and BQ4 are off. Therefore, a conflict between signal potentials does not occur in the structure wherein the plurality of local sense amplifiers are connected to common read data bus 8r, and the memory cell data is accurately transmitted by the emitter follower operation of bipolar transistors BQ3 and BQ4 in the on state.

Figure 14:
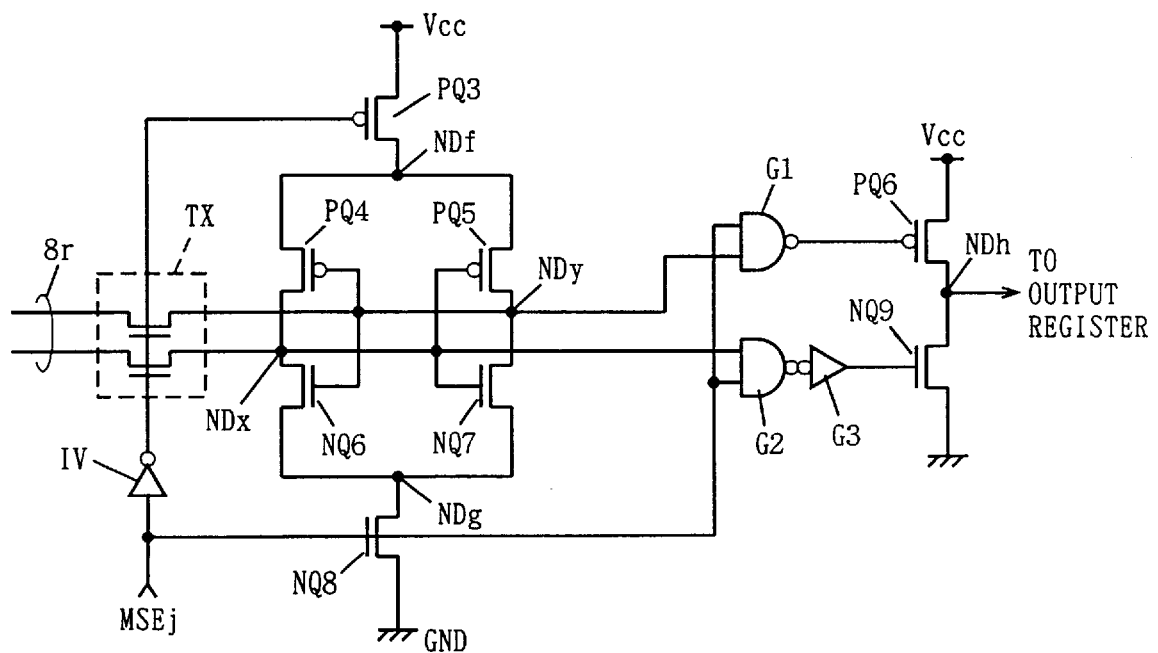
FIG. 14 shows a structure of a main sense amplifier shown in FIG. 5.

FIG. 14 shows an example of a specific structure of the main sense amplifier. In FIG. 14, the main sense amplifier includes a transfer gate TX responsive to main sense amplifier activating signal MSEj (j=0 or 1) applied through an inverter IV for connecting common read data bus 8r to nodes NDx and NDy, a p-channel MOS transistor PQ3 connected between the power supply node and a node NDf and receiving on its gate the output signal of inverter IV, p- and n-channel MOS transistors PQ4 and NQ6 connected in series between nodes NDf and NDg and having respective gates connected to a node NDy, p- and n-channel MOS transistors PQ5 and NQ7 connected in series between nodes NDf and NDg and having respective gates connected to a node NDx, and an n-channel MOS transistor NQ8 connected between node NDg and the ground node and receiving main sense amplifier activating signal MSEj on its gate. MOS transistors PQ4 and NQ6 form a CMOS inverter, and MOS transistors PQ5 and NQ7 form another CMOS inverter.

The main sense amplifier further includes a NAND circuit GI receiving main sense amplifier activating signal MSEj and the signal on node NDy, a NAND circuit G2 receiving main sense amplifier activating signal MSEj and the signal on node NDx, an inverter G3 inverting the output signal of NAND circuit G2, a p-channel MOS transistor PQ6 connected between the power supply node and a node NDh, and receiving on its gate the output signal of NAND circuit Gi, and an n-channel MOS transistor NQ9 connected between node NDh and ground node and receiving on its gate the output signal of inverter G3. An operation will now be described below.

When main sense amplifier activating signal MSEj is at L-level and inactive, transfer gate TX is on, and MOS transistors PQ3 and NQ8 are off. In this state, nodes NDx and NDy are electrically connected to the corresponding bus lines of common read data bus 8r, respectively, and are precharged to a predetermined voltage level by the precharge/equalize circuit provided at the common read data bus. The output signals of NAND circuits G1 and G2 attain H-level so that both MOS transistors PQ6 and NQ9 are turned off, and node NDh attains a high impedance state.

When main sense amplifier activating signal LSEj attains H-level or the active state, MOS transistors PQ3 and NQ8 are turned on, and nodes NDf and NDg are electrically coupled to the power supply node and the ground node, respectively. Meanwhile, transfer gate TX is turned off in response to the output signal of inverter IV, and the data amplified by the local sense amplifier and applied onto common read data bus 8r is confined on nodes NDx and NDy. When MOS transistors PQ3 and NQ8 are on, and the CMOS inverter formed of MOS transistors PQ4 and NQ6 as well as the CMOS inverter formed of MOS transistors PQ5 and NQ7 operate to amplify and latch the signal potentials on nodes NDx and NDy.

Transfer gate TX is off, and the changes in signal potential on nodes NDx and NDy to power supply voltage Vcc level or ground voltage GND level do not apply any influence on common read data bus 8r. When the voltage levels on nodes NDx and NDy are made definite, the output signals of NAND circuits G1 and G2 change in accordance with the voltage levels on nodes NDx and NDy. When the voltage on node NDx is at H-level, the voltage on node NDy is at L-level, and NAND circuits G1 and G2 generates the output signals at H- and L-levels, respectively. Each of MOS transistors PQ6 and NQ9 is supplied on its gate the signal at H-level, and data at L-level is supplied onto node NDh. When the voltage on node NDx is at L-level, NAND circuits G1 and G2 generates the output signals at L- and H-levels, respectively, so that MOS transistors PQ6 and NQ9 are supplied on their gates with the signals at L-level, and the voltage on node NDh attains H-level.

When main sense amplifier activating signal MSEj is inactive, MOS transistors PQ6 and NQ9 are off, and node NDh is in the high impedance state (floating state). Even when node NDh is coupled commonly to the other main sense amplifiers, the output signal of the main sense amplifier provided for the nonselected memory block does not adversely affect the output data of the active main sense amplifier at all.

FIG. 15 shows an example of a structure of a precharge/equalize portion of the common read data bus. In FIG. 15, a precharge/equalize circuit 32 is provided for common read data bus 8r. Precharge/equalize circuit 32 is activated when main sense amplifier activating signal MSEj is inactive, to precharge the respective bus lines of common read data bus 8r to power supply voltage Vcc level. Precharge/equalize circuit 32 includes p-channel MOS transistors PTc and PTd receiving main sense amplifier activating signal MSEj on their gates, and precharges the bus lines of common read data bus 8r to the power supply voltage level. Precharge/equalize circuit 32 shown in FIG. 15 is provided for each of common read data buses 8ra and 8rb.

According to precharge/equalize circuit 32 shown in FIG. 15, as shown in a timing chart of FIG. 16, main sense amplifier activating signal MSE0 is activated in clock cycle #a, and this main sense amplifier activating signal MSE0 will be activated again in clock cycle #c spaced in time by one clock cycle. In clock cycle #b, main sense amplifier activating signal MSE0 is inactive, and another main sense amplifier activating signal MSE1 is activated. Main sense amplifier activating signal MSE1 will be activated in clock cycle #d spaced in time by one clock cycle. Thus, each of main sense amplifier activating signals MSE0 and MSE1 maintains the inactive state for at least one clock cycle and, common read data buses 8ra and 8rb can be precharged reliably during these inactive periods, respectively. Accordingly, even if the clock signal CLK has a short cycle time, common read data buses 8ra and 8rb can be precharged reliably to the predetermined voltage level, and the main sense amplifiers can be operated at fast timing so that data reading can be performed accurately.

[Changing Sequence of the Burst Address]

FIG. 17 shows input/output signals of the burst address counter. FIG. 17 does not show an address advance signal instructing updating of the burst address. In FIG. 17, burst address counter 3 changes address signal bits A0 and A1 received from the address register in a predetermined sequence during the burst mode, and produces internal address signals Ai0 and Ai1. The address changing sequence of burst address counter 3 depends on an externally supplied mode designating signal MODE. When mode designating signal MODE is set to L-level, the linear burst mode is designated, and otherwise the interleaved burst mode is designated.

FIG. 18A shows the changing sequence of internal address signal bits Ai0 and Ai1 in the interleaved burst mode. In the first cycle, external address signal bits A1 and A0 are applied as internal signal bits Ai0 and Ai1. In the second cycle, address signal bit A0 is inverted, and complemental address signal bit /A0 makes internal address signal bit Ai0. Internal address signal bit Ai1 is equal to address signal bit A1. In the third cycle in the burst mode, address signal bit A1 is inverted, and complemental address signal bit /A1 is output as internal address signal bit Ai1. Address signal bit A0 is output as internal address signal bit Ai0. In the fourth cycle, both address signal bits A1 and A0 are inverted, and both complemental address signal bits /A1 and /A0 are output as internal address signals Ai1 and Ai0. Lower address signal bit Ai0 changes every clock cycle, and higher address signal bit Ai1 changes every other cycle. Since these 2-bits of address signals' Ai1 and Ai0 are used as the block address, the even-numbered and odd-numbered memory blocks are alternately selected at successive clock cycles.

FIG. 18B shows a sequence of selection of the memory blocks in this interleaved burst mode. When block select signal BS0 is activated in the first cycle, block select signals BS1, BS2 and BS3 are activated in the following second, third and fourth cycles, respectively.

Meanwhile, when block select signal BS1 is activated in the first cycle, block select signals BS0, BS3 and BS2 are successively activated at the second, third and fourth cycles, respectively.

When block select signal BS2 is activated in the first cycle, block select signals BS3, BS0 and BS1 are activated in this order.

When block select signal BS3 is activated in the first cycle, block select signals BS2, BS1 and BS0 are successively activated in the subsequent cycles, respectively.

As can be clearly seen from FIG. 18B, the even-numbered and odd-numbered memory blocks are alternately and successively activated. Even in the case where the address changes in the foregoing interleaved burst mode, the memory blocks can be successively selected, and the main sense amplifiers can be alternately activated.

Meanwhile, in the linear burst mode, burst address counter 3 operates merely as a 2-bit counter which in turn performs the counting from the initial value determined by address signal bits A1 and A0 applied thereto.

Figures 19, 20:
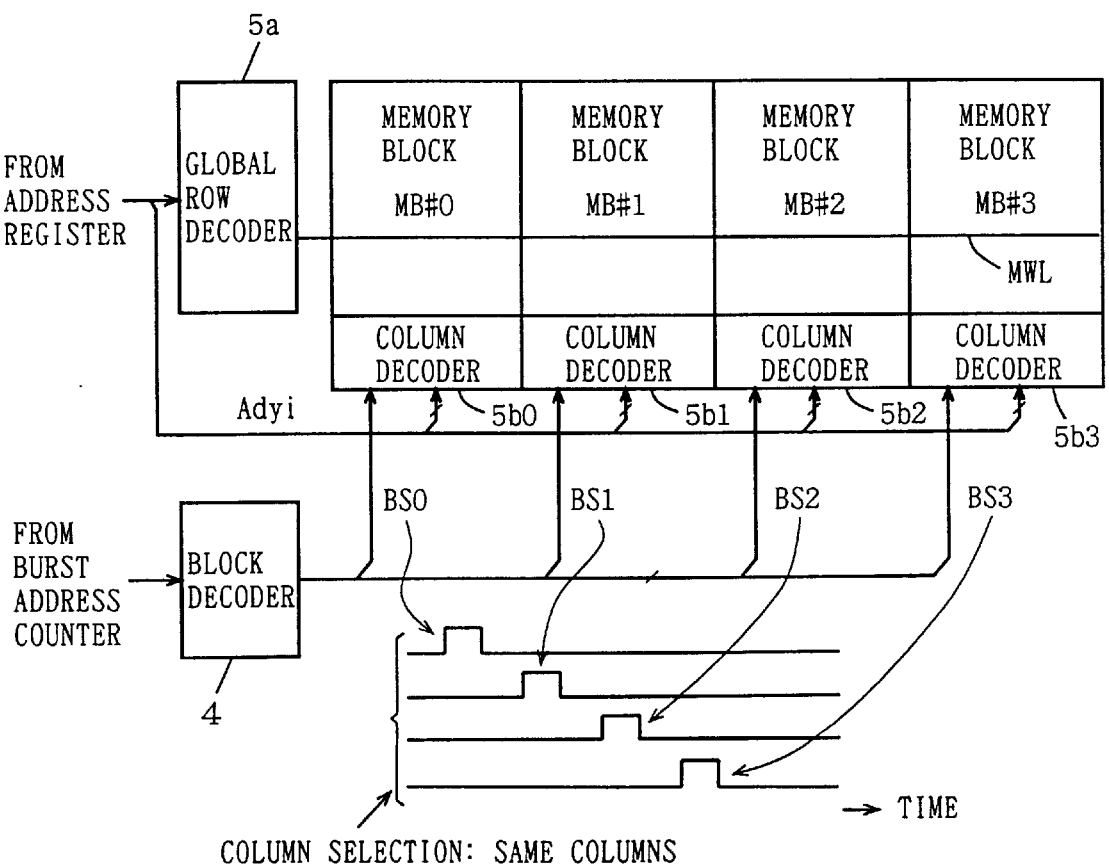
FIG. 19 shows a sequence of selecting memory blocks in a linear burst mode of a burst address counter shown in FIG. 3.
FIG. 20 schematically shows a structure of a main portion of a synchronous semiconductor memory device according to an embodiment 2 of the invention.

FIG. 19 shows a manner of change in block select signal in the linear burst mode. In the linear burst mode, as shown in FIG. 19, block select signals BS0, BS1, BS2 and BS3 are cyclically activated in this order during the operation in the linear burst mode. In this linear burst mode, the operation is performed in the same manner as that in the foregoing case wherein the address successively changes in the order of A, A+1, A+2 and A+3. The even-numbered and odd-numbered memory blocks are alternately selected.

Therefore, regardless of whether the changing of this burst address is performed in the linear burst mode or the interleaved burst mode, the local sense amplifiers can be successively activated, and the main sense amplifiers can be activated alternately. Thereby, the common read data buses can be precharged and equalized with a margin, and data can be reliably read even in a high frequency operation.

According to the embodiment 1 of the invention, as described above, the output signal of the burst address counter is used for selecting a block when data is to be read in the burst mode. Therefore, the memory blocks can be successively selected in the burst mode, and different local sense amplifiers can be activated in respective clock cycles. Accordingly, the local data buses can be precharged and equalized with a margin, and it is not necessary to delay the timing for activating the local sense amplifiers so that fast data reading can be performed.

The even-numbered memory blocks can use the main sense amplifier different from that provided for the odd-numbered memory blocks, and these main sense amplifiers are alternately activated. Therefore, the common read data buses can be precharged and equalized with a margin, and data can be reliably read even in a high frequency operation.

Further, the activating signal for the main sense amplifier is produced based on the local sense amplifier activating signal of the corresponding memory block. Therefore, the main sense amplifier can be activated after activating the local sense amplifier, and the main sense amplifier can accurately latch, amplify and output the data transmitted from this local sense amplifier. Also, there is almost no period during which undefinite data is generated, and the data of the main sense amplifier can be set to the definite state at a fast timing, which allows fast reading. This is because a fast latch timing of the output register can be set.

[Second Embodiment]

FIG. 20 schematically shows a structure of a main portion of a synchronous semiconductor memory device according to an embodiment 2 of the invention. In FIG. 20, column decoders 5b0, 5b1, 5b2 and 5b3, which are activated in response to block select signals BS0–BS3 received from block decoder 4, are provided corresponding to memory blocks MB#0–MB#3, respectively. Column decoders 5b0–5b3 are commonly supplied with internal column address signal Adyi from the address register. Similarly to the embodiment 1, block decoder 4 receives address signal bits from the burst address counter. Global row decoder 5a receives the internal row address signal from the address register, and selectively drives main word lines MWL arranged commonly to memory blocks MB#0–MB#3 to the selected state.

In the structure shown in FIG. 20, memory blocks MB#0–MB#3 are individually driven. Column decoders 5b0–5b3 are provided corresponding to memory blocks MB#0–MB#3, and are selectively activated in accordance with block select signals BS0–BS3, respectively. Owing to this arrangement, the lengths of column select signal transmission lines can be shortened, and the column selection can be performed at high speed to couple a selected column to the local sense amplifier. As shown in FIG. 20, the column decoder is activated only during the active period of the block select signal, and the column selection is performed only in the selected memory block.

Figure 21:
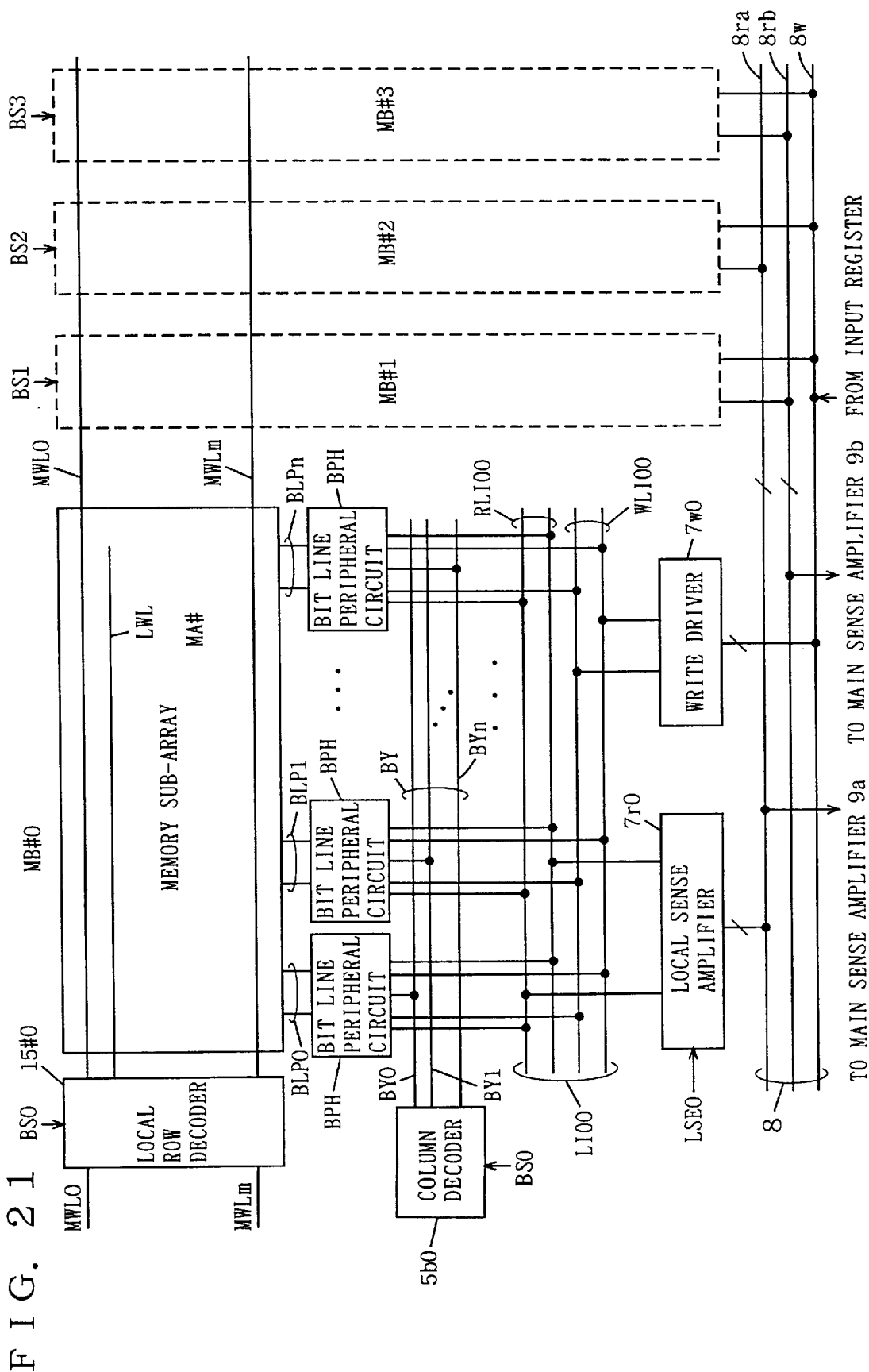
FIG. 21 shows more specifically a structure of a memory block shown in FIG. 20.

FIG. 21 shows more specifically the structure of the memory block shown in FIG. 20. In FIG. 21, memory blocks MB#0–MB#3 have the same structure, and only memory block MB#0 is shown in detail. In FIG. 21, column decoder 5b0 is activated in accordance with block select signal BS0, to decode the internal column address signal (not shown) applied from the address register for driving one of block select signals BY0–BYn to the selected state. A column select line group BY for these signals extends only within memory block MB#0. Local data bus LIO0 includes a local read data bus line pair RLIO0 for transmitting read data, and a local write data bus line pair WLIO0 for transmitting written data.

Bit line peripheral circuits BPH provided for bit line pairs BLP0–BLPn electrically connect corresponding bit line pairs BLP0–BLPn to local read data bus line pair RLIO0 and local write data bus line pair WLIO0 in accordance with column select signals BY0–BYn applied from column decoder 5b0. Local read data bus line pair RLIO0 is coupled to local sense amplifier 7r0 which in turn is activated in response to local sense amplifier activating signal LSE0, and local write data bus line pair WLIO0 is coupled to write driver 7w0. The output of local sense amplifier 7r0 is applied to common read data bus 8ra of common data bus 8. Write driver 7w0 is coupled to common write data bus 8w included in common data bus 8.

Local row decoder 15#0 is activated in response to activation of block select signal BS0, to drive a local word line LWL, which is selected in accordance with the word line select signal on main word lines MWL0–MWLm, to the selected state.

Each of memory blocks MB#1–MB#3 has the same structure as the foregoing structure. The local sense amplifiers in memory blocks MB#1 and MB#3 are coupled to common read data bus 8rb included in common data bus 8, and the local sense amplifier in memory block MB#2 is coupled to common read data bus 8ra. The structure for these amplifiers is the same as the structure of the embodiment 1 shown in FIG. 1. Common read data bus 8ra transmits read data to main sense amplifier 9a, and common read data bus 8rb transmits read data to main sense amplifier 9b.

The structure shown in FIG. 21 differs from that of the embodiment 1 in that local I/O line pair LIO0 is divided into local read data bus line pair RLIO0 and write data bus line pair WLIO0. Owing to provision of the independent local data bus line pairs for the data writing and for data reading, respectively, it is possible to reduce a parasitic capacitance by the write driver at read data bus line pair RLIO0 for data reading, and the potential on read data bus line pair LIO0 can be changed rapidly. A selected bit line pair is coupled to the local write data bus line pair. In the data read operation, this local write data bus line pair is precharged to substantially the same precharge potential as that of the bit line pair, and operates merely as a current source, so that the local write data bus line pair does not adversely affect the change in potentials on the bit lines at all.

In the structure shown in FIG. 21, the column decoders are provided at memory blocks MB#0–MB#3, respectively. These column decoders perform column selection (decoding) only when the corresponding block select signals BS0–BS3 are active, respectively. In contrast to the embodiment 1, the column select signal (the same column) is driven to the selected state in synchronization with the block select signal in each of memory blocks MB#0–MB#3 (see the waveform diagram of FIG. 20).

According to the embodiment 2 of the invention, as described above, each memory block includes the dedicated column decoder and, in each memory block, the column selection is performed in accordance with the block select signal. Therefore, the lengths of the column select signal lines can be made short, and the column select signal can be rapidly driven to the selected state, so that the memory cell data can be quickly transmitted to the local sense amplifier. Since the local data bus provided for each memory block includes the read data bus line pair for data reading and the write data bus line pair for data writing provided independently from each other, the read data bus line pair for data reading is not connected to the circuit for data writing, and has a reduced parasitic capacitance, so that the potential on the read data bus line pair can be rapidly changed in accordance with the memory cell data, and the local sense amplifier can be activated at a fast timing, which allows fast reading.

[Embodiment 3]

Figure 22:
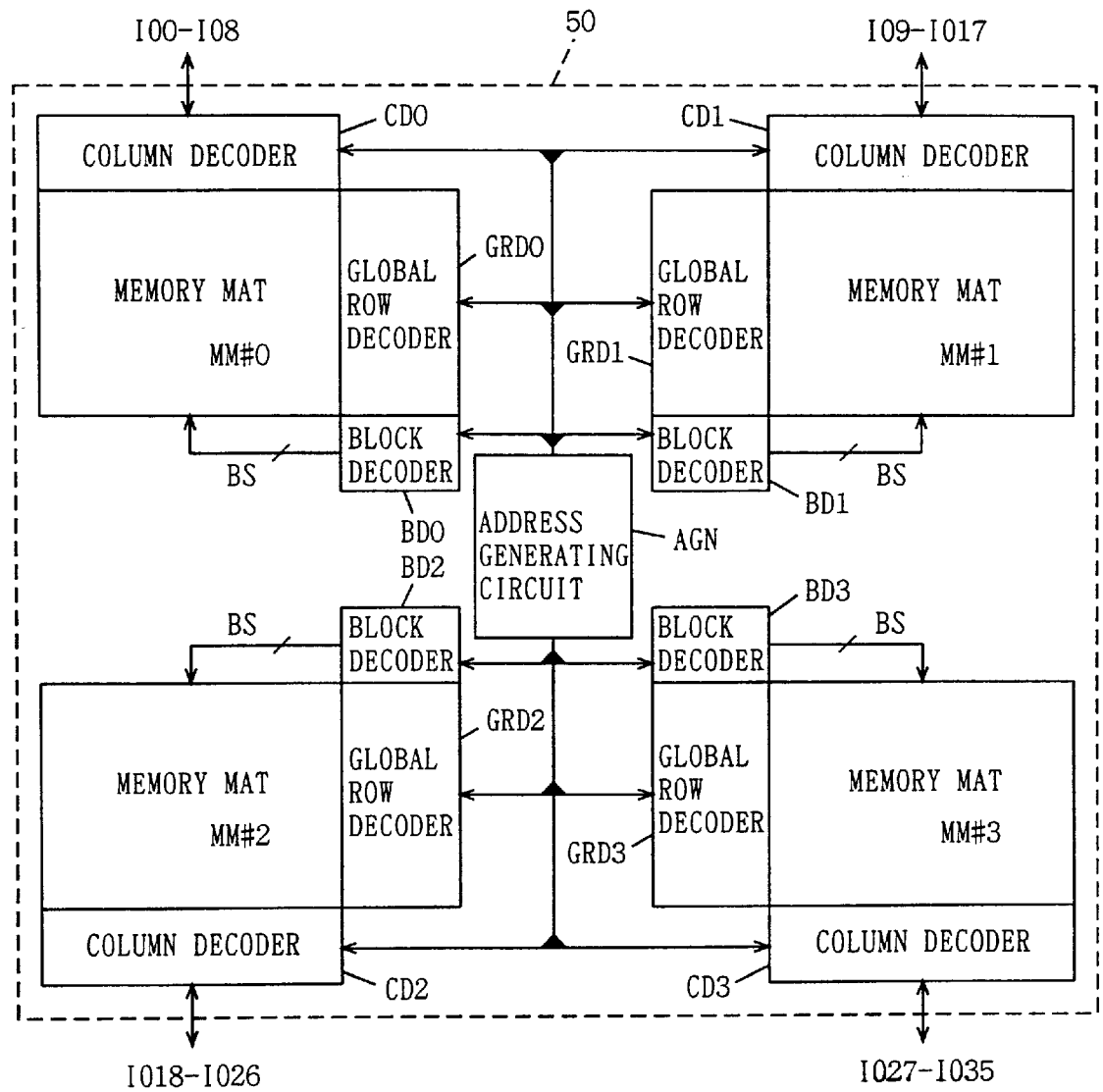
FIG. 22 schematically shows a whole structure of a synchronous semiconductor memory device according to an embodiment 3 of the invention.

FIG. 22 schematically shows a whole structure of a BSRAM according to an embodiment 3 of the invention. In FIG. 22, BSRAM 50 includes four memory mats MM#0–MM#3 provided separatedly from each other. Memory mat MM#0 is provided for data I/O terminals IO0–IO8. Memory mat MM#1 is provided for data I/O terminals IO9–IO17. Memory mat MM#2 is provided for data I/O terminals IO18–IO26. Memory mat MM#3 is provided for data I/O terminals IO27–IO35. Each of memory mats MM#0–MM#3 performs input/output of data of 9 bits simultaneously with the other memory mats. The 9-bit data is input and output because a parity bit of 1 bit is added to data of 8 bits.

Global row decoders GRD0–GRD3, column decoders CD0–CD3 and block decoders BD0–BD3 are arranged for memory mats MM#0–MM#3, respectively. These decoders GRD0–GRD3, CD0–CD3 and BD0–BD3 are supplied with the internal address signal from an address generating circuit AGN. Address generating circuit AGN includes an address register and a burst address counter, and the output signal of the burst address counter is applied commonly to block decoders BD0–BD3 as the block address signal. Address generating circuit AGN may include a predecoder, which provides such an advantage that the scale of the decoder can be reduced, and decoder input signal lines to be charged and discharged can be reduced in number.

Address generating circuit AGN is arranged at a center in a region between memory mats MM#0–MM#3 so that the interconnection layout can be made symmetrical, and the interconnection length can be minimized, which allows fast transmission of signals. Each of memory mats MM#0–MM#3 includes a plurality of memory blocks, and have data of 9 bits in a selected memory block accessed in accordance with the block select signals applied from corresponding block decoder BD0, BD1, BD2 and BD3.

Figure 23:
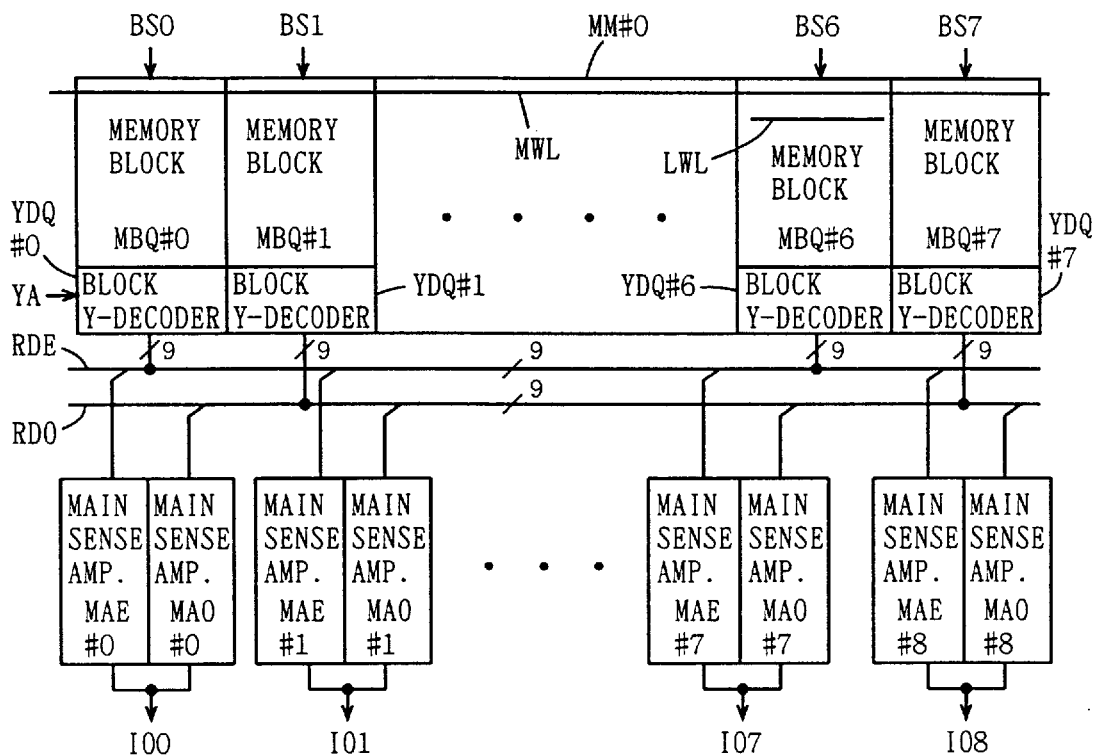
FIG. 23 shows more specifically a structure of one memory mat in the synchronous semiconductor memory device shown in FIG. 22.

FIG. 23 shows a structure of memory mat MM#0 shown in FIG. 22 more in detail. Other memory mats MM#1–MM#3 have the same structure as memory mat MM#0 shown in FIG. 23.

In FIG. 23, memory mat MM#0 is divided into memory blocks MBQ#0–MBQ#7, each of which performs input/output of data of 9 bits when selected. Block Y-decoders YDQ#0–YDQ#7 for performing the column selection are provided corresponding to memory blocks MBQ#0–MBQ#7, respectively. Address generating circuit AGN (address register) applies an internal column address signal YA commonly to block Y-decoders YDQ#0–YDQ#7. Block Y-decoders YDQ#0–YDQ#7 are activated when block select signals BS0–BS7 applied to corresponding memory blocks MBQ#0–MBQ#7 are active, respectively, to simultaneously select the memory cells of 9 bits (i.e., 9 columns) in the corresponding memory block.

Common read data buses RDE and RDO each having a 9-bit width are provided for memory blocks MBQ#0–MBQ#7. Common read data bus RDE is coupled to even-numbered memory blocks MBQ#0, MBQ#2, . . . MBQ#6, and common read data bus RDO is coupled to odd-numbered memory blocks MBQ#1, MBQ#3, . . . MBQ#7.

Main sense amplifiers MAE#0–MAE#8 are coupled to the bus line pairs of common read data bus RDE, respectively, and main sense amplifiers MAO#0–MAO#8 are coupled to the bus line pairs of common read data bus RDO, respectively. Main sense amplifiers MAE#i and MAO#i are paired with each other, and are coupled to a data I/O terminal IOi (i=0–8). In each memory block, the memory cells of 9 bits are simultaneously selected, and the data of the selected memory cells is transmitted onto the corresponding common read data bus. Different memory blocks are activated in respective clock cycles. However, in both the linear burst mode and the interleaved burst mode, the even-numbered memory blocks and the odd-numbered memory blocks are alternately selected so that 9-bit read data buses RDE and RDO alternately receive the data. Main sense amplifiers MAE#0–MAE#8 and main sense amplifiers MAO#0–MAO#8 are activated in accordance with the activating signals of the corresponding local sense amplifiers, respectively, when data is transmitted onto the corresponding read data buses.

Figure 24:
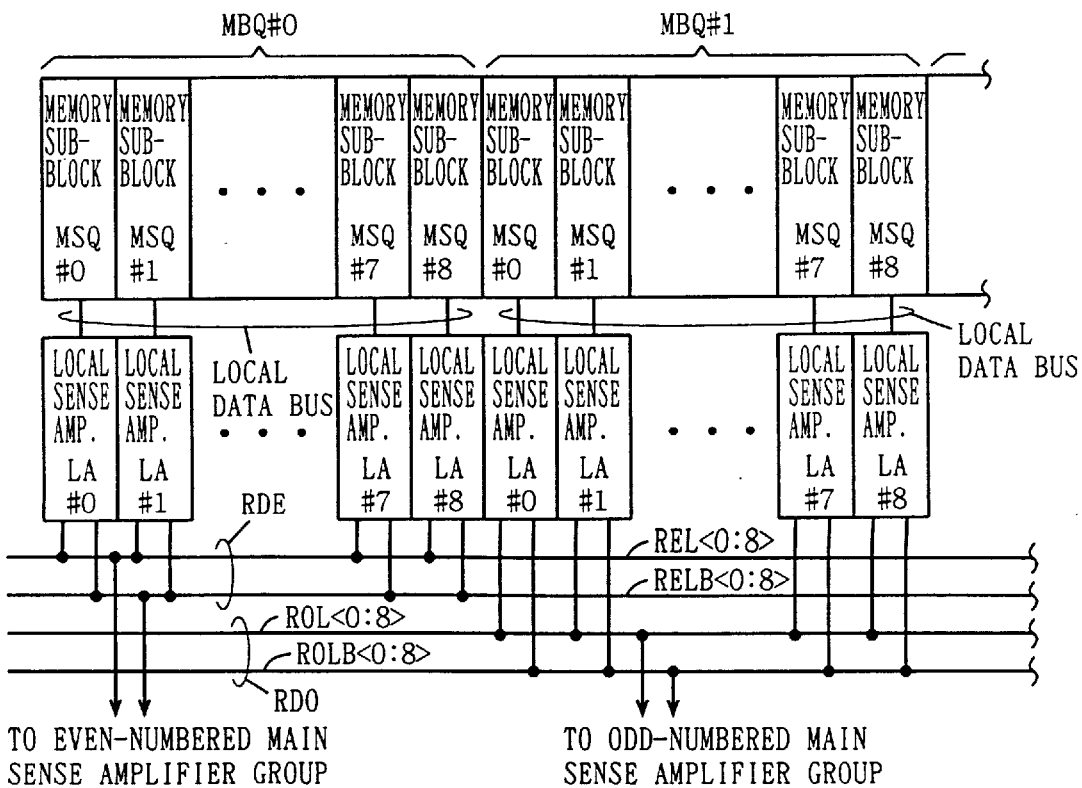
FIG. 24 shows more specifically structures of memory blocks shown in FIG. 23.

FIG. 24 shows structures of memory blocks MBQ#0 and MBQ#1. Memory blocks MBQ#2–MBQ#7 have the same structure as that in FIG. 24.

In FIG. 24, each of memory blocks MBQ#0 and MBQ#1 is divided into nine memory regions, i.e., memory sub-blocks MSQ#0–MSQ#8. Memory sub-blocks MSQ#0–MSQ#8 are required only to form nine regions with respect to the column addresses, and be configured such that, in a memory block MBQ#0, for example, the memory cells of 9 bits neighboring to each other are simultaneously selected. For clearly showing that each of memory blocks MBQ#0–MBQ#7 is divided into nine memory regions, FIG. 24 shows memory sub-blocks MSQ#0–MSQ#8 as a column block containing columns successively neighboring to each other. Each memory sub-block may have the same structure as that of either the embodiment 1 or 2.

Local sense amplifiers LA#0–LA#8 are arranged corresponding to memory sub-blocks MSQ#0–MSQ#8, respectively. Local sense amplifiers LA#0–LA#8 provided for memory block MBQ#0 are coupled to bus lines REL<0:8> and RELB<0:8> of common read data bus RDE. Bus lines REL<0:8> and RELB<0:8> have widths of 9 bits, and local sense amplifiers LAO#0–LAO#8 are coupled to the bus lines in one-to-one correspondence, respectively.

Local sense amplifiers LA#0–LA#8 of memory block MBQ#1 are connected to bus lines ROL<0:8> and ROLB<0:8> of read data bus RDO.

Bus lines REL<0:8> and RELB<0:8> are coupled to a group of the even-numbered main sense amplifiers (MAE#0–MAE#8), and bus lines ROL<0:8> and ROLB<0:8> are coupled to a group of odd-numbered main sense amplifiers (MAO#0–MAO#8).

In the selected memory block, memory cell data of 1 bit is transmitted from each of memory sub-blocks MSQ0–MAQ8 to the corresponding one of local sense amplifiers LA#0–LA#8. These local sense amplifiers LA#0–LA#8 are simultaneously activated to perform the sensing operation, and data of 9 bits are read out from the selected memory block.

In the case where the local word lines are 512 in number and column select signal Y selects one from 16 columns, one mat has 512 rows, 16 columns, 8 blocks and 9 I/Os, and has a structure of 65536·9-I/O. Thus, the device having four memory mats MM#0–MM#3 as shown in FIG. 22 has a structure of 65536·9-I/O•4-mat, and implements a BSRAM of 64K·36-I/O.

Figure 25:
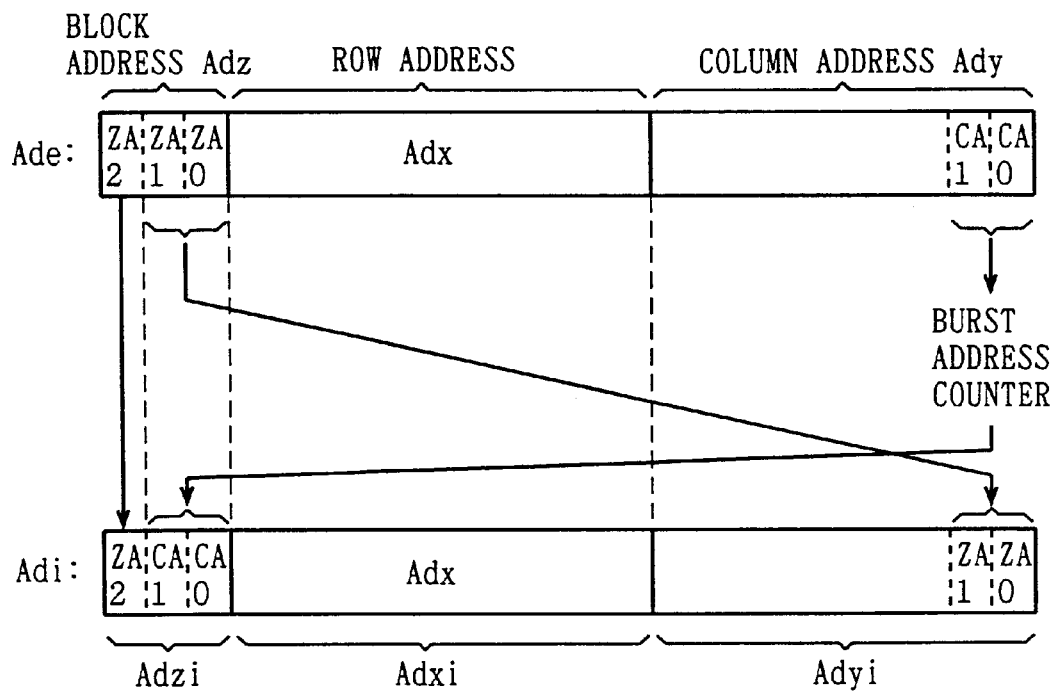
FIG. 25 shows a relationship between an external address signal and an internal address signal in the embodiment 3 of the invention.

FIG. 25 shows a relationship between the external and internal address signals in the embodiment 3 of the invention. In the burst mode, if the data access is performed in accordance with addresses which in turn are internally and successively produced, a 3-bit burst address counter may be used. In this case, 3 bits generated from the burst address counter may be used as the block address signal, whereby different memory blocks can be selected in respective clock cycles even if the memory blocks are eight in number. In both the linear burst mode and the interleaved burst mode, the least significant bit in the burst address counter changes every clock cycle so that the even-numbered and odd-numbered memory blocks can be alternately selected. FIG. 25 shows the relationship between the external and internal address signals in the case where a 2-bit burst address counter is used.

In FIG. 25, external address signal Ade includes a block address signal Adz having three bits ZA2, ZA1 and ZA0, and further includes row address signal ADx and column address signal Ady each having a predetermined number of bits. Least significant two bits CA1 and CA0 of column address signal Ady are applied to the burst address counter.

In internal address signal Adi, block address signal Adzi has the output signal of the burst address counter at its least significant two bits, and has the most significant bit of block address signal Adz of the external address signal at its most significant bit position. Thus, internal block address signal Adzi includes bits ZA2, CA1 and CA0. Internal row address signal Adxi is the same as row address signal Adx of the external address signal. Internal column address signal Adyi (YA) applied to block Y-decoders YDQ#0–YDQ#7 includes least significant two bits ZA1 and ZA0 of the block address signal of the external address signal at its least significant two bit positions. Thus, lowest two bits of block address signal Adz are replaced with lowest two bits of the column address signal.

In the burst mode, lowest two bits CA1 and CA0 of internal block address signal Adzi change every clock cycle (the 2-bit count value formed of bits CA1 and CA0 changes every clock cycle). The most significant bit ZA2 does not change.

Figure 26:
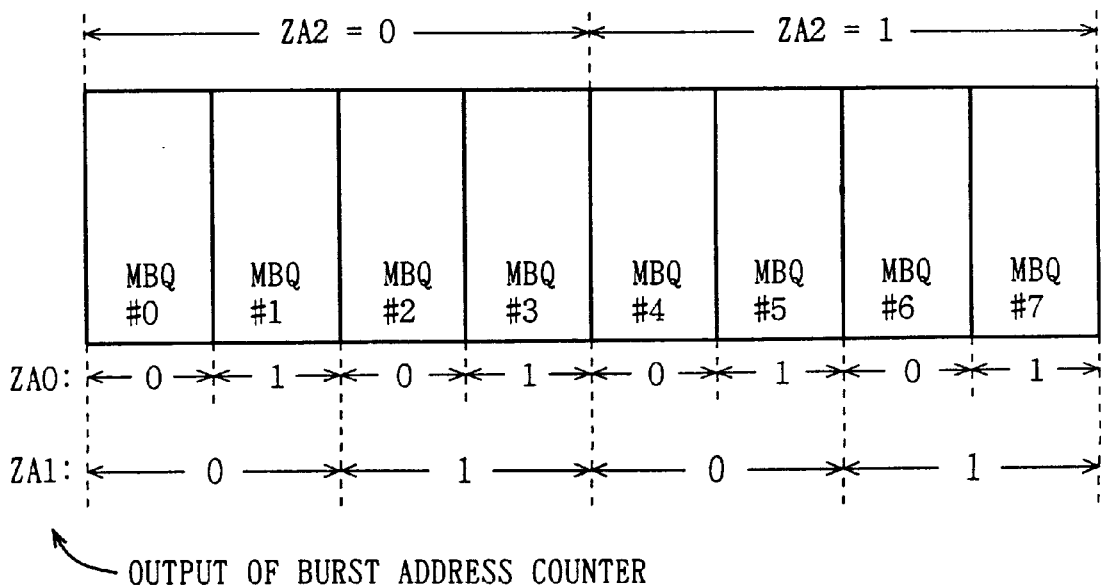
FIG. 26 shows an example of allocation of block address signal bits to memory blocks in the synchronous semiconductor memory device of the embodiment 3 of the invention.
Figure 27:
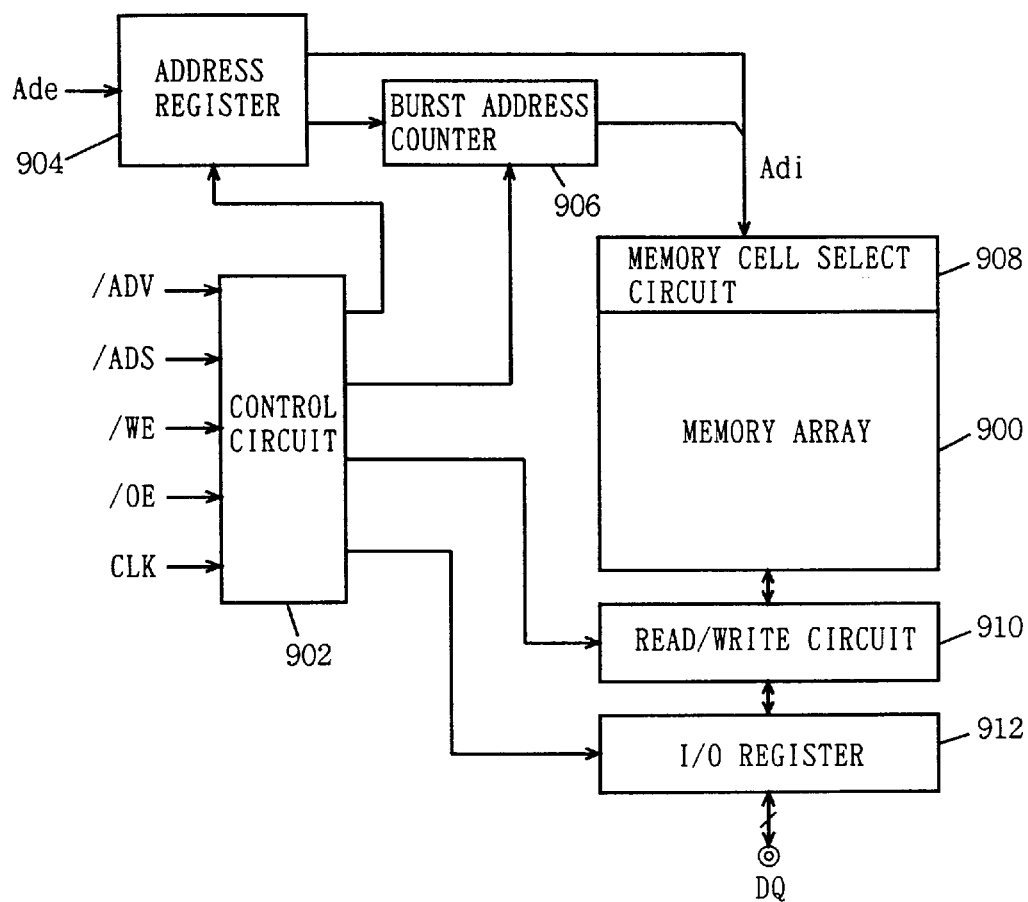
FIG. 27 schematically shows a whole structure of a synchronous semiconductor memory device in the prior art.
Figure 28:
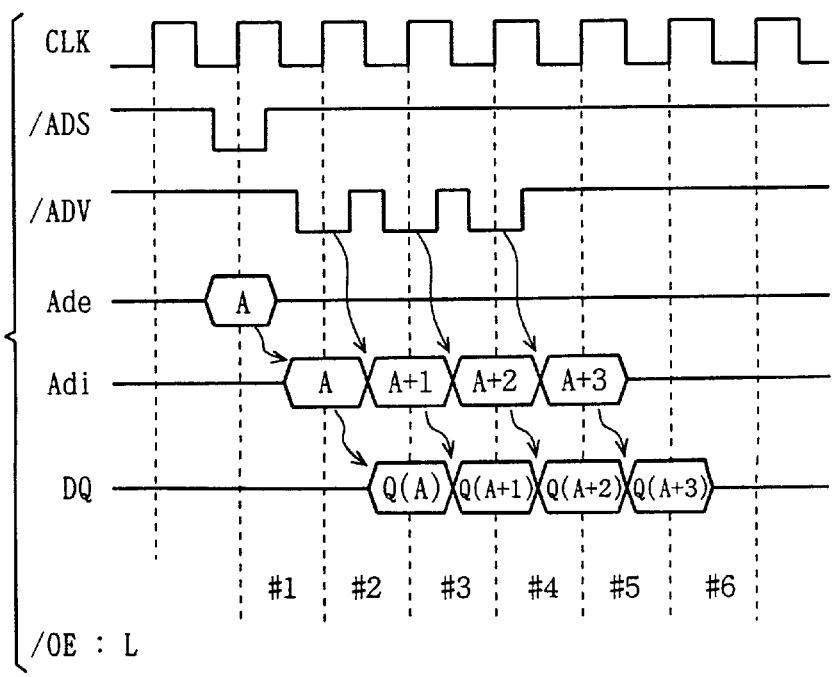
FIG. 28 is a timing chart representing an operation of the synchronous semiconductor memory device in the prior art shown in FIG. 27.
Figure 29:
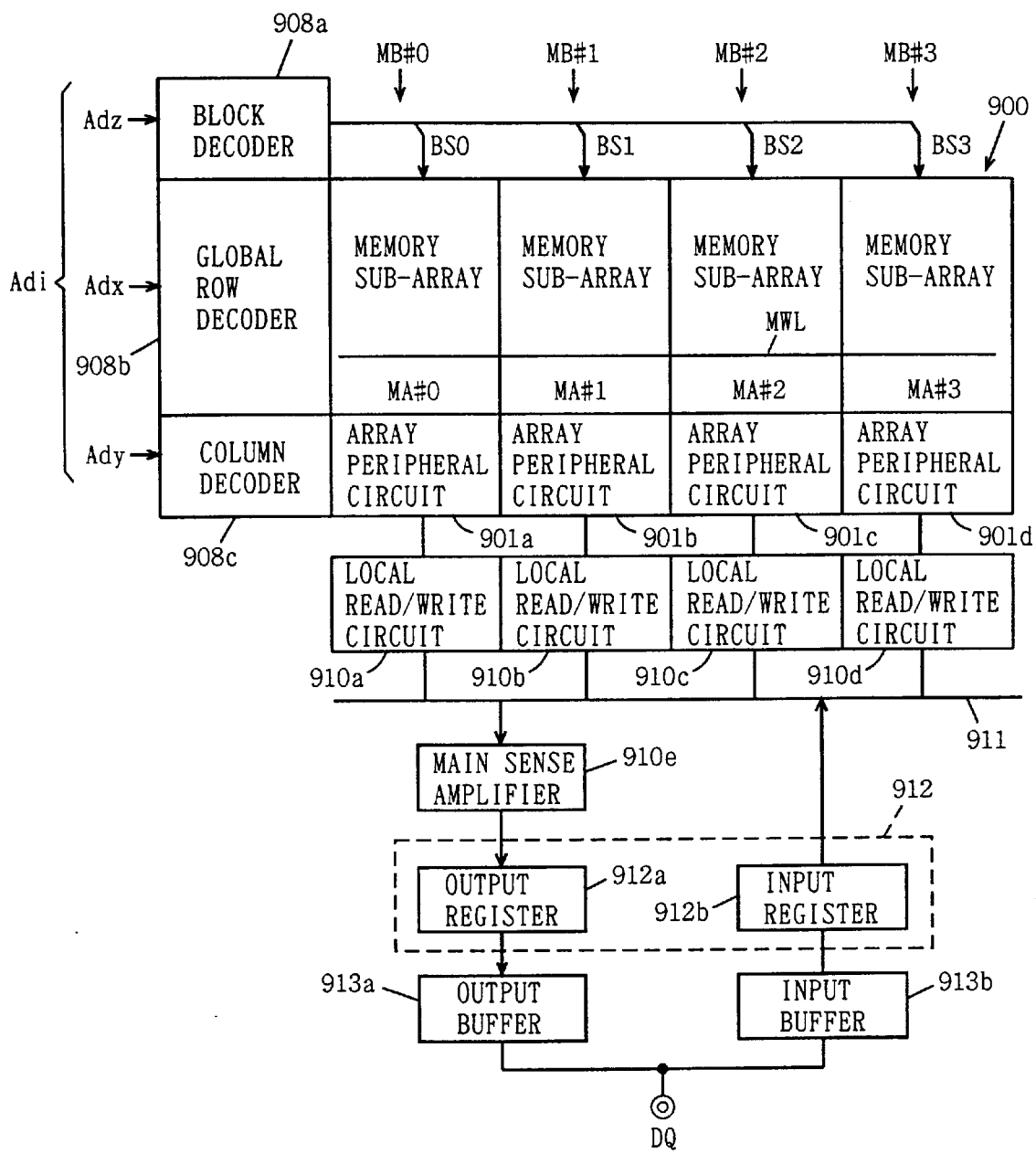
FIG. 29 schematically shows structures of a memory array and a data read portion in the synchronous semiconductor memory device in the prior art shown in FIG. 27.
Figure 30:
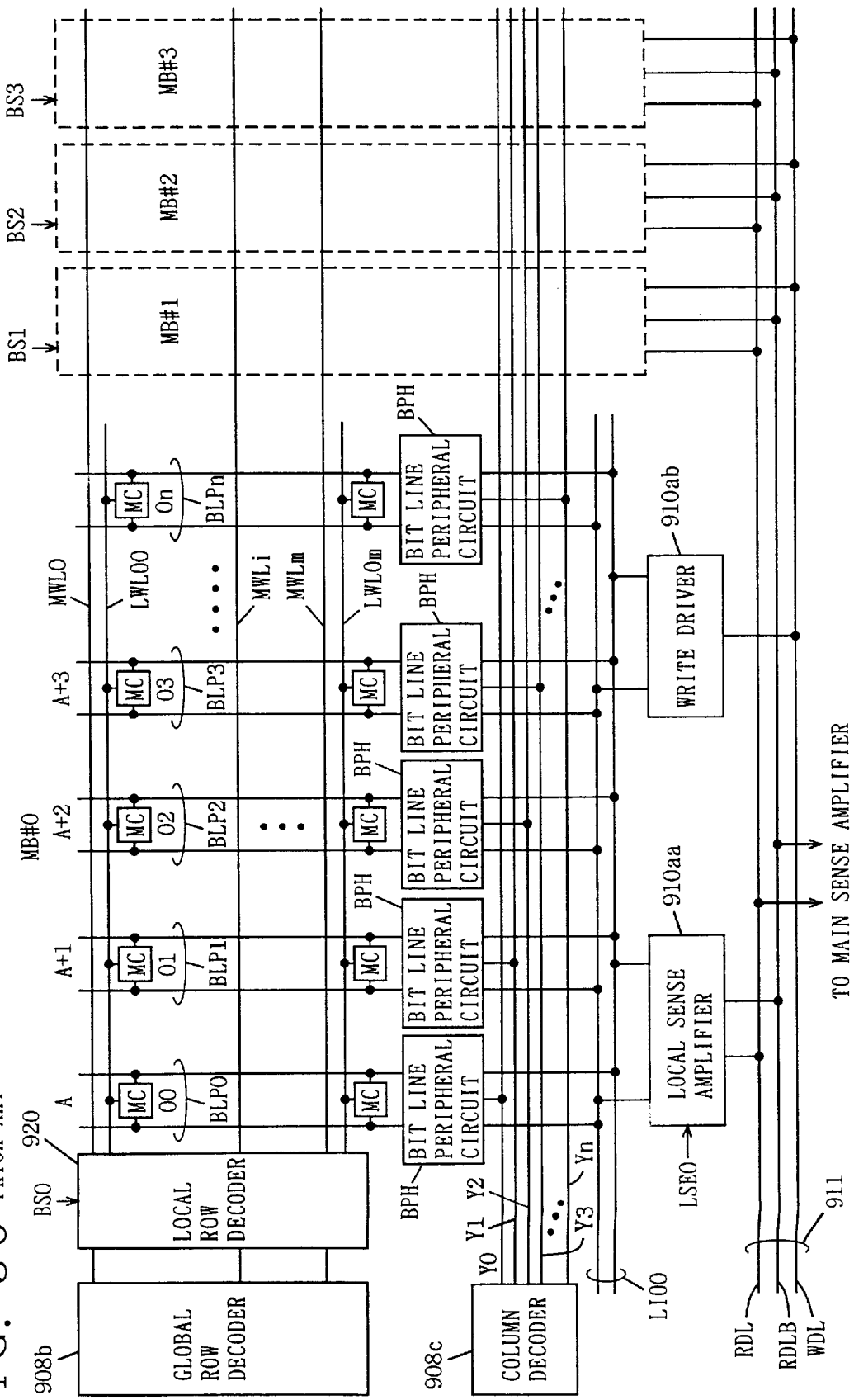
FIG. 30 shows more specifically structures of a memory block and a local read/write circuit shown in FIG. 29.
Figure 31:
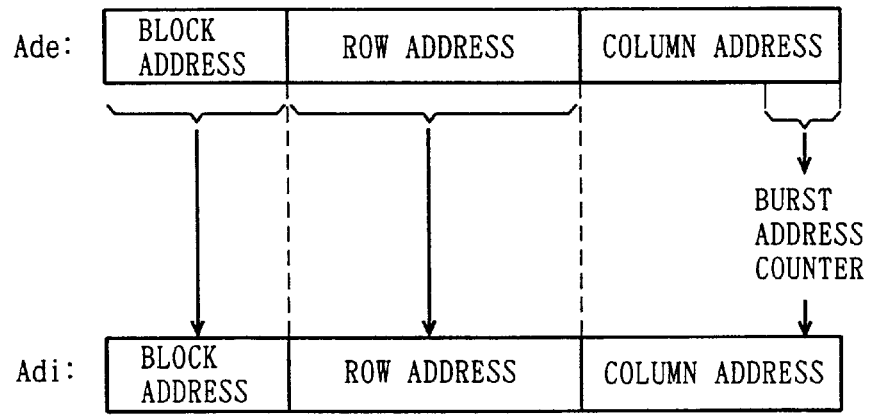
FIG. 31 shows a relationship between an external address signal and an internal address signal in the synchronous semiconductor memory device in the prior art.
Figure 33:
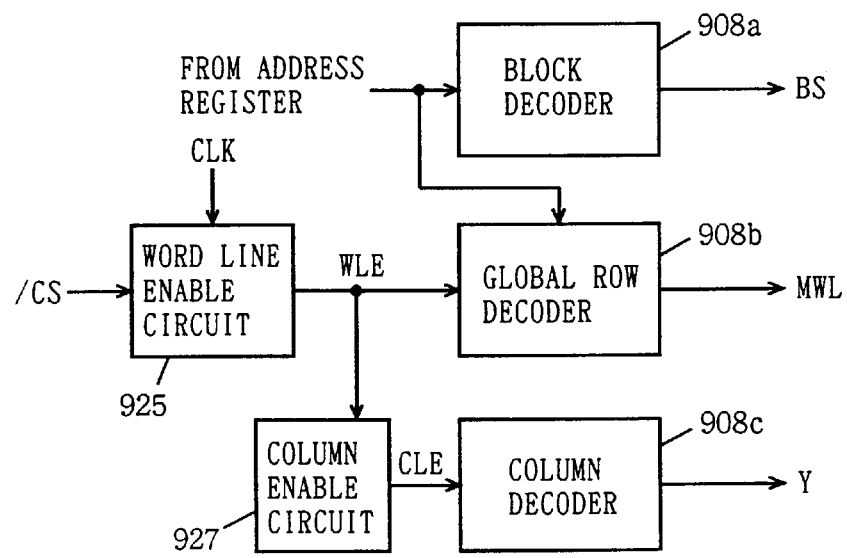
FIG. 33 schematically shows a structure of a control signal generating portion in the synchronous semiconductor memory device in the prior art.
Figure 34:
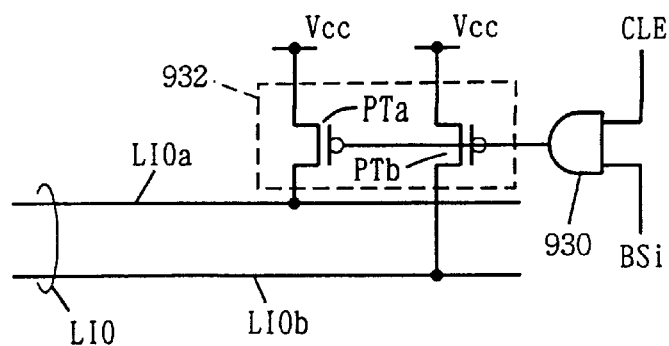
FIG. 34 shows a structure of a precharge/equalize circuit portion of a local data bus in the synchronous semiconductor memory device in the prior art.
Figure 32:
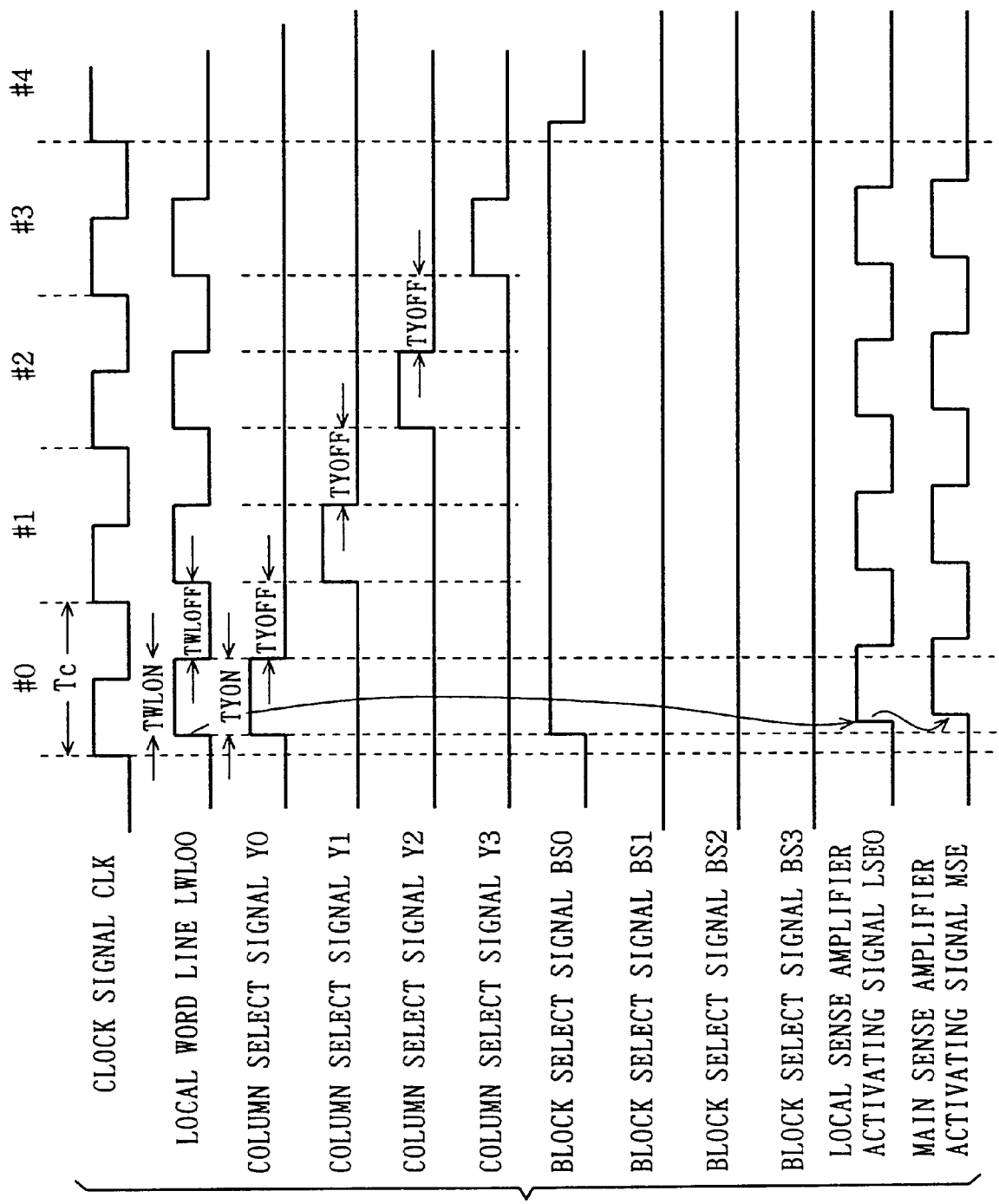
FIG. 32 is a timing chart representing an operation of the synchronous semiconductor memory device shown in FIGS. 29 and 30.
Figure 35:
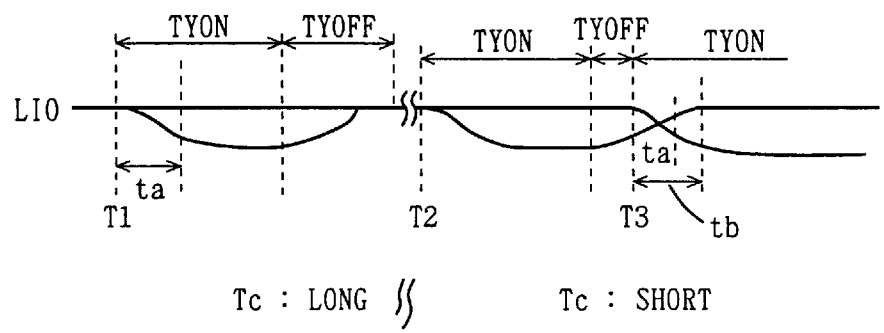
FIG. 35 shows a problem of the precharge/equalize circuit shown in FIG. 34.
Figure 36:
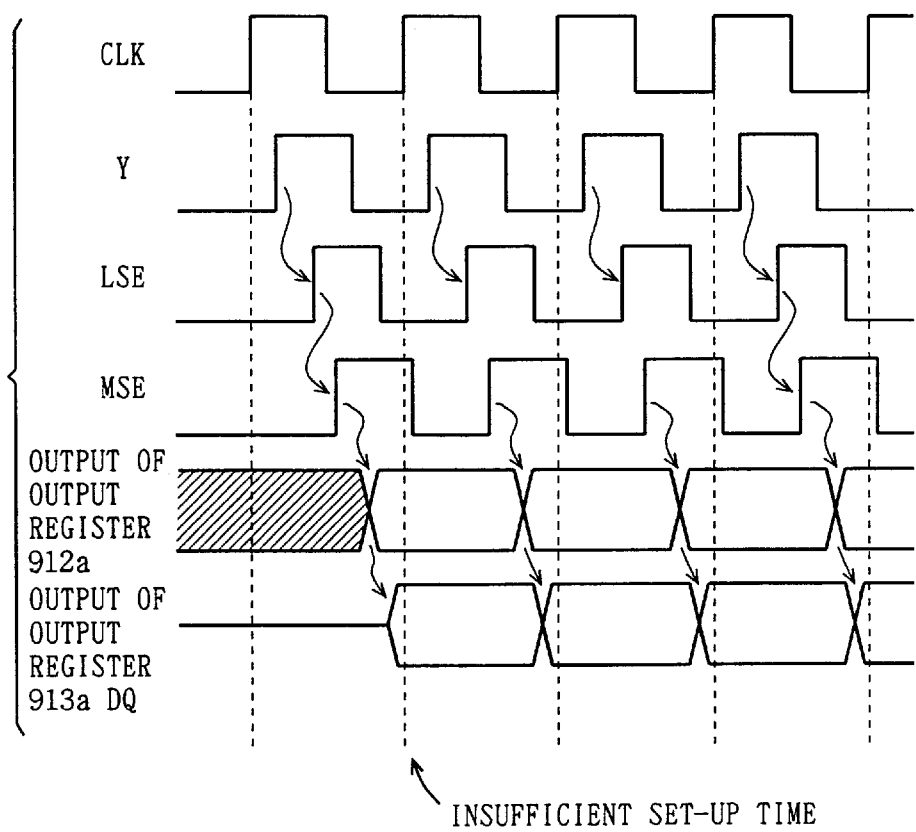
FIG. 36 shows a disadvantage of the synchronous semiconductor memory device in the prior art.

FIG. 26 shows an example of allocation of the block address signal bits for the memory blocks in one memory mat. In FIG. 26, block address bit ZA2 designates either the group formed of memory blocks MBQ#0–MBQ#3 or the group of memory blocks MBQ#4–MBQ#7. Memory blocks MBQ#0–MBQ#3 are designated when bit ZA2 is 0, and memory blocks MBQ#4–MBQ#7 are designated when bit ZA2 is 1.

Bit ZA1 designates two memory blocks neighboring to each other in the memory block group designated by bit ZA2. Thus, memory blocks MBQ#0 and MBQ#1 as well as MBQ#4 and MBQ#5 are designated when bit ZA1 is 0. When bit ZA1 is 1, memory blocks MBQ#2 and MBQ#3 as well as MBQ#6 and MBQ#7 are designated.

Bit ZA0 designates the even-numbered or odd-numbered memory blocks. More specifically, even-numbered memory blocks MBQ#0, MBQ#2, MBQ#4 and MBQ#6 are designated when bit ZA0 is 0. When bit ZA0 is 1, odd-numbered memory blocks MBQ#1, MBQ#3, MBQ#5 and MBQ#7 are designated.

In the structure wherein the block address signal bits in the external address signal are allocated to the memory blocks as described above, block address signal bits ZA0 and ZA1 are internally replaced with the output bits of the burst address counter. In the memory block group designated by bit ZA2, four memory blocks are successively selected in a predetermined sequence. The order of selection of the four memory blocks is the same as that in the embodiment 1. In this case, the even-numbered and odd-numbered memory blocks are alternately selected. Therefore, even in the structure including eight memory blocks, fast reading can be performed, as can be done in the embodiments 1 and 2, by using the output of the burst address counter of 2 bits for selecting the memory blocks.

[Another Example of Application]

The above description has been given on the structure and the operation for data reading. During data writing, the memory blocks are likewise selected successively in a predetermined sequence so that it is not necessary to delay the timing for activating the write driver, and therefore fast data writing can be achieved. Further, the common write data bus may be divided into independent buses for the even-numbered memory blocks and for the odd-numbered memory blocks, and data held in the input register may be transmitted selectively onto these write data buses in accordance with the block select signal, whereby the write data bus can be precharged and equalized with a sufficient margin, and the write driver can be operated at a fast timing in accordance with the write data transferred from the input register.

The foregoing description is given on the BSRAM. However, the invention can be applied to another synchronous semiconductor memory device, provided that the device has a burst mode in which memory cells are accessed by successively changing the address in a predetermined sequence starting from an external address after this external address was once applied. A clock-synchronous dynamic random access memory (SDRAM) is an example of such a synchronous semiconductor memory device.

According to the invention, as described above, different memory blocks are selected in a predetermined sequence during the operation in the burst mode. Therefore, the local data bus can be precharged and equalized with a margin during data reading, and the local sense amplifiers can be activated at a fast timing for reading the data.

Since the main sense amplifiers are provided for a plurality of groups of the memory blocks, respectively, these main sense amplifiers can be activated in a predetermined sequence so that the common data bus can be precharged and equalized with a margin, and thereby the main sense amplifiers can be activated at a fast timing, resulting in fast reading.

Since the activating signal for the main sense amplifier is produced based on the activating signal of the local sense amplifier, activation of the main sense amplifier can be reliably performed after activation of the local sense amplifier, and the main sense amplifier can accurately amplify the data transmitted from the local sense amplifier, which achieves the accurate data amplifying operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device comprising:

a plurality of array blocks each including a plurality of memory cells arranged in rows and columns, the rows of each of the array blocks being isolated from the rows in other memory array; and selection circuitry coupled to said plurality of array blocks, for selecting a memory cell in a different array block in a different clock cycle of a clock signal for data accessing in accordance with an internal address signal internally generated in synchronization with the clock signal.

2. The synchronous semiconductor memory device according to claim 1, wherein said selection circuitry includes:

address generating means for generating the internal address signal in accordance with an external address signal applied in synchronization with said clock signal, said internal address signal being generated successively in a predetermined sequence in synchronization with said clock signal;

a plurality of local amplifier means provided corresponding to said plurality of array blocks, each for amplifying data of the selected memory cell in a corresponding array block when activated;

selection/read means for performing selection of array blocks among said plurality of array blocks in the predetermined sequence and selection of a memory cell in a selected block such that memory cells in different array blocks are selected in respective clock cycles in accordance with the internal address signals generated by said address generating means, and activating the local amplifier means corresponding to the selected array block among said plurality of local amplifier means; and output means for producing external read data in accordance with the output data signal of the activated local amplifier means among said plurality of local amplifier means.

3. The synchronous semiconductor memory device according to claim 2, wherein said selection/read means includes means for selecting memory cells on a same common column in the different array blocks among said plurality of array blocks in synchronization with said clock signal and in accordance with the internal address signal generated by said address generating means.

4. The synchronous semiconductor memory device according to claim 2, wherein said external address signal includes a multibit block address signal for designating an array block, a multibit row address signal for designating a row in each of the array blocks, and a multibit column address signal for designating a column in each of the array blocks;

said address generating means includes means for changing a predetermined set of bits of said multibit column address signal in a prescribed sequence in synchronization with said clock signal; and said selection/read means includes:
   array block selection means for selecting an array block from said plurality of array blocks in accordance with at least said predetermined set of bits, and
   selector means for selecting a memory cell in a selected array block in accordance with remaining bits of the row, block and column address signals except the bits used for selecting the array block.

5. The synchronous semiconductor memory device according to claim 4, wherein said selector means includes:
   means for selecting a memory cell row in the selected array block in accordance with said row address signal and an output signal generated by said array block selection means; and
   means for selecting a memory cell column in the selected array block in accordance with the output signal of said array block selection means, and the remaining bits of said block address signal and said column address signal, respective bits of said predetermined set of bits of said column address signal replacing with corresponding bits of the block address signal.

6. The synchronous semiconductor memory device according to claim 4, wherein said memory cell selection means includes:
   means for selecting a memory cell row in the selected array block in accordance with an output signal of said array block selection means and said multibit row address signal; and
   means provided commonly to said plurality of array blocks for selecting a memory cell column in each of said array blocks in accordance with the remaining bits of said multibit block address signal and said multibit column address signal.

7. The synchronous semiconductor memory device according to claim 4, wherein said selector means includes:
   means for selecting a memory cell row in the selected array block in accordance with an output signal of said array block selection means and said multibit row address signal; and
   means provided corresponding to each of the array blocks for selecting a memory cell column in the selected array block in accordance with the output signal of said array block selection means, and the remaining bits of said multibit block address signal and said multibit column address signal.

8. The synchronous semiconductor memory device according to claim 2, wherein said plurality of array blocks are grouped into a plurality of groups; and said output means includes:
   a plurality of data buses provided corresponding to the respective groups and each being coupled commonly to the local amplifier means of a corresponding group, and
   a plurality of main amplifier means provided corresponding to said plurality of data buses, each for amplifying a data signal on a corresponding data bus.

9. The synchronous semiconductor memory device according to claim 8, wherein each of said plurality of local amplifier means includes: a local read data bus provided independently of a write data bus for transmitting write data and being coupled to a selected column in a corresponding array block, and a local sense amplifier activated to amplify a data signal on said local read data bus when the corresponding array block is selected in a data read operation.

10. The synchronous semiconductor memory device according to claim 8, further including:

a plurality of main sense amplifier activating means provided corresponding to said plurality of main amplifier means for activating corresponding main amplifier means in accordance with activating signals for the local amplifier means of the corresponding groups, respectively.

11. A synchronous semiconductor memory device comprising:

a burst address counter for taking in an external multibit address signal applied in synchronization with an externally applied clock signal, and changing a predetermined bit of the taken multibit address signal in a predetermined sequence in synchronization with the clock signal for outputting;

a plurality of array blocks each having a plurality of memory cells arranged in rows and columns;

a block decoder for selecting an array block from said plurality of array blocks in accordance with at least an output bit of said burst address counter;

selector for selecting a memory cell in an array block selected by said block decoder in accordance with remaining bits of said taken multibit address signal other than the bit applied to said block decoder; and read output circuitry for reading data of the memory cell selected by said selector for outputting in synchronization with said clock signal.

12. The synchronous semiconductor memory device according to claim 11, wherein said read output circuitry includes:
   a plurality of local sense amplifiers provided corresponding to the respective array blocks and each activated to amplify a data of a selected memory cell in a corresponding array block when the corresponding array block is selected in a data read mode operation, and
   output means for producing output data in accordance with the amplified data applied from an activated local sense amplifier among said plurality of local sense amplifiers, and externally outputting the produced output data in synchronization with said clock signal.

13. The synchronous semiconductor memory device according to claim 12, wherein said plurality of local sense amplifiers are grouped into a plurality of groups, and said output means includes a plurality of main amplifiers provided corresponding to the respective groups, each being coupled to receive commonly the output signals of the local sense amplifiers of a corresponding group for amplifying an applied signal, and having a commonly coupled output.

14. A synchronous semiconductor memory device comprising:

a memory array including a plurality of memory blocks each having a plurality of array blocks each having a plurality of memory cells arranged in rows and columns;

address generating means provided commonly to said plurality of memory blocks for generating, in synchronization with a clock signal, an internal address signal changing in a predetermined sequence starting from an external address signal applied in synchronization with said clock signal;

a plurality of local amplifier means provided corresponding to said plurality of array blocks for amplifying data of selected memory cells in corresponding array blocks when activated, respectively;

selection/read means for selecting memory blocks of said plurality of memory blocks in a predetermined sequence and selecting a memory cell in each of said plurality of array blocks in a selected memory block in accordance with the internal address signal generated by said address generating means, and activating a corresponding local amplifier means; and a plurality of output means coupled to said plurality of memory blocks, respectively, for producing external read data in parallel with each other in accordance with output data of the plurality of local amplifier means provided corresponding to the selected memory block.

15. The synchronous semiconductor memory device according to claim 14, wherein said selection/read means includes:
memory block selecting means for selecting a memory block, and
memory cell selecting means for selecting memory cells in the respective array blocks in the selected memory block in parallel with each other;
each of said external address signal and said internal address signal includes a plurality of bits; and
said address generating means includes:
input means for taking in said external address signal in synchronization with said clock signal;
burst counter means for changing a set of predetermined bits of the address signal taken by said input means in a prescribed sequence in synchronization with said clock signal for application to said memory block selecting means, and
means for applying to said memory cell selecting means the bits, other than bits used for selection of a memory block, of the address signal generated from said input means.

16. The synchronous semiconductor memory device according to claim 14, wherein said plurality of memory blocks are grouped into a plurality of groups;
each of said plurality of output means includes:
a plurality of data buses provided corresponding to said plurality of groups of said plurality of memory blocks, respectively, and
a plurality of main amplifier means provided corresponding to said plurality of data buses for amplifying data signals on the data buses when activated, respectively, each of the main amplifier means including a plurality of main sense amplifiers provided commonly to the memory blocks of a corresponding group and provided corresponding to the array blocks, respectively; and
each of said plurality of main amplifier means is activated in response to activation of the local amplifier means of the corresponding group.

17. The synchronous semiconductor memory device according to claim 14, wherein each of said plurality of local amplifier means includes;
a read data bus provided independently of a write data bus for transmitting write data, and a plurality of local sense amplifiers provided corresponding to the array blocks in a corresponding memory block, respectively, and coupled to said read data bus.

18. The synchronous semiconductor memory device according to claim 15, wherein said external address signal and said internal address signal each include a multibit block address signal for designating a memory block, a multibit row address signal for designating a row, and a column address signal for designating a column, and said set of the predetermined bits is included in the column address signal of the external address signal and is included in the block address signal of said internal address signal, and bits of the block address signal of the external address signal corresponding to said set are included in the column address signal of the internal address signal.

* * * * *